(12) United States Patent
Hirairi

(10) Patent No.: US 8,570,086 B2
(45) Date of Patent: Oct. 29, 2013

(54) DELAY LATCH CIRCUIT AND DELAY FLIP-FLOP

(75) Inventor: Koji Hirairi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/323,378

(22) Filed: Dec. 12, 2011

(65) Prior Publication Data

US 2012/0194246 A1 Aug. 2, 2012

(30) Foreign Application Priority Data

Jan. 27, 2011 (JP) .................................. 2011-014726

(51) Int. Cl.
*H03K 3/356* (2006.01)

(52) U.S. Cl.
USPC ............ 327/212; 327/218; 327/219; 327/225

(58) Field of Classification Search
USPC .................. 327/208, 212, 215, 218, 219, 225
See application file for complete search history.

(56) References Cited

U.S. PATENT DOCUMENTS

| | | | | | |
|---|---|---|---|---|---|
| 4,779,011 | A | * | 10/1988 | Tsunoi et al. | 327/225 |
| 5,373,200 | A | * | 12/1994 | Hasegawa et al. | 327/218 |
| 5,781,053 | A | * | 7/1998 | Ramirez | 327/215 |
| 6,249,163 | B1 | * | 6/2001 | Campbell | 327/218 |

OTHER PUBLICATIONS

H. Kaul, et al., "A 300 mV 494GOPS/W Reconfigurable Dual-Supply 4-Way SIMD Vector Processing Accelerator in 65 nm CMOS," ISSCC Dig. of Tech. Papers, pp. 260-261, Feb. 2009.

* cited by examiner

*Primary Examiner* — William Hernandez
(74) *Attorney, Agent, or Firm* — Rader, Fishman & Grauer PLLC

(57) ABSTRACT

Disclosed herein are a delay latch circuit and a delay flip-flop circuit arranged to inhibit the increase in power consumption while preventing malfunction under low voltage conditions. An internal signal output circuit outputs as an internal signal an inverted signal of a data signal starting from an internal transparency start timing until an internal transparency end timing. From the internal transparency end timing until the internal transparency start timing, the internal signal output circuit outputs a fixed value signal as the internal signal. A transistor delays the output internal signal over a time period which ranges from a hold instruction delay timing to the issuance of a data transparency instruction and which includes the internal transparency end timing therebetween.

24 Claims, 16 Drawing Sheets

F I G . 5
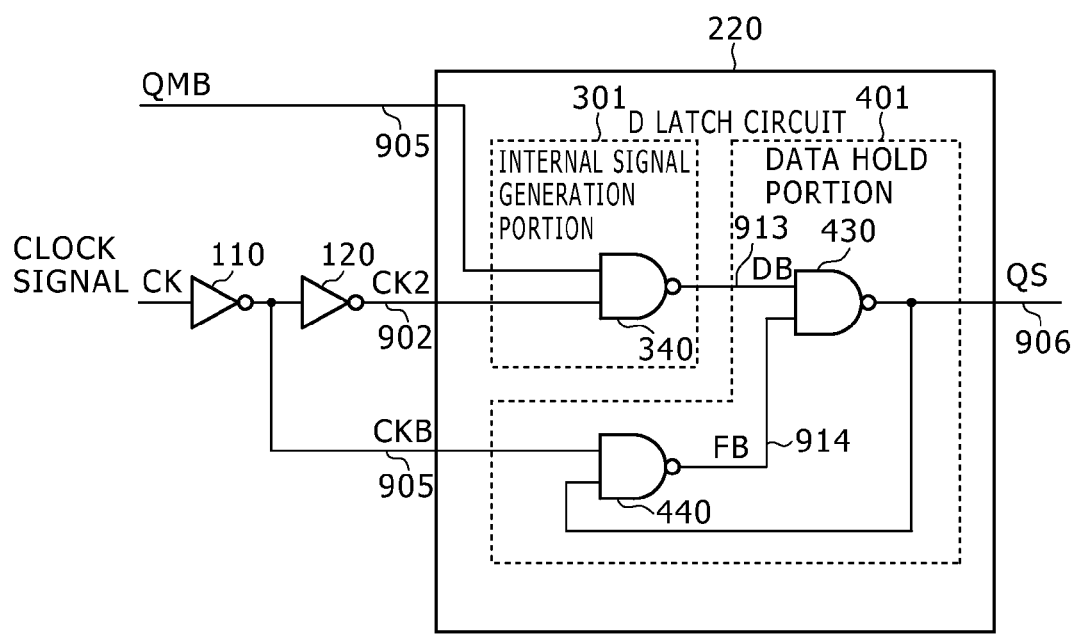

FIG.8

| DATA SIGNAL D | CLOCK SIGNAL CK | OUTPUT SIGNAL QM |
|---|---|---|
| 0 | L | 0 |
| 1 | L | 1 |
| × | H | HOLD |

FIG.10

| CLOCK SIGNAL CK | DATA SIGNAL D | TIME PERIOD | INTERNAL SIGNAL DB |
|---|---|---|---|
| L (TRANSPARENT) | Dt | $T_{D2}$ | 0 |
|  |  | $T_{D1}$ | $\overline{Dt}$ |
| H (HOLD) |  | $T_{D2}$ | 0 |

FIG.11

| CLOCK SIGNAL CK | INTERNAL SIGNAL DB | TIME PERIOD | FEEDBACK SIGNAL FB | OUTPUT SIGNAL QM |
|---|---|---|---|---|
| L (TRANSPARENT) | 0 | $T_{F2}$ | $\overline{Dt-1}$ | Dt-1 |
| | | $T_{F1}$ | 0 | Dt |
| | $\overline{Dt}$ | | | |
| H (HOLD) | (0) | | | (1) |
| | $\overline{Dt}$ | | | Dt |
| | | $T_{F2}$ | $\overline{Dt-1}$ | |
| | 0 | | | Dt-1 |

DELAY LATCH CIRCUIT AND DELAY FLIP-FLOP

BACKGROUND

The present disclosure relates to a delay latch circuit and a delay flip-flop. More particularly, the disclosure relates to a delay latch circuit and a delay flip-flop that may be used under low voltage conditions.

Heretofore, sequential circuits have used D (delay) latch circuits and D flip-flops as circuits that hold a state each. These D latch circuits and D flip-flops may employ wired OR (logical add) circuits. The wired OR circuit is a circuit that provides the OR logic by connecting a plurality of outputs in parallel. For example, consider a D latch circuit or a D flip-flop circuit that holds bit information using an inverter loop. A wired OR circuit is formed when two inverters constituting the inverter loop are wired parallelly to a suitable gate terminal that inputs data to the inverter loop. While circuits in the recent years have tended to be required to operate under low voltage conditions, the wired OR circuit has been known to malfunction from time to time at low voltage (e.g., see H. Kaul, et al., "A 300 mV 494GOPS/W reconfigurable dual-supply 4-Way SIMD vector processing accelerator in 65 nm CMOS," ISSCC Dig. of Tech. Papers, pp. 260-261, February 2009, hereinafter referred to as Non-Patent Document 1). Specifically, the ratio of a current $I_{on}$ flowing in the on-state to a current $I_{off}$ flowing in the off-state ($I_{on}/I_{off}$) generally drops as the voltage is lowered. The drop in the $I_{on}/I_{off}$ ratio can generate contention between the drive current and leak current in the wired OR circuit. The contention thus generated prevents the inverter loop from holding its correct information, causing the circuit to malfunction.

In order to forestall such malfunction under low voltage conditions, a D latch circuit having four two-input NAND (negative AND) gates and a D flip-flop having a two-stage latch circuit structure have been proposed (e.g., see Takashi Minamidani, "Basics of Logic Circuits" (in Japanese), Saiensu-sha, May 2009, p. 124, hereinafter referred to as Non-Patent Document 2). This latch circuit is furnished with two cross-connected NAND gates and two NAND gates that input data to the cross-connected NAND gates. In this structure, wired OR circuits are not used in the D latch circuit and D flip-flop so that current contention will not develop at a reduced $I_{on}/I_{off}$ ratio. This prevents the malfunction of D latch circuits and D flip-flops under low voltage conditions.

SUMMARY

However, the above-mentioned existing technique has difficulty in preventing malfunction at low voltage while inhibiting the increase in the power consumption of D latch circuits and D flip-flops. Specifically, in the case of the D latch circuit having four NAND gates, the circuit does not malfunction under low voltage conditions but consumes more power because of its many NAND gates. In the case of the D latch circuit equipped with the inverter loop, the circuit consumes less power but may malfunction at low voltage because it includes a wired OR circuit. For these reasons, it has been difficult to implement a D latch circuit or a D flip-flop that can prevent malfunction while inhibiting the increase in power consumption at low voltage.

The present disclosure has been made in view of the above circumstances and provides a D latch circuit or a D flip-flop circuit arranged to inhibit the increase in power consumption while preventing malfunction under low voltage conditions.

According to one embodiment of the present disclosure, there is provided a delay latch circuit including: an internal signal output circuit configured to output an inverted signal of a data signal as an internal signal starting from an internal transparency start timing in effect upon elapse of a first delay time following issuance of a data transparency instruction until an internal transparency end timing in effect upon elapse of the first delay time following issuance of a data hold instruction, the internal signal output circuit further outputting a fixed value signal as the internal signal starting from the internal transparency end timing until the internal transparency start timing. The delay latch circuit further includes a transistor configured to delay the output internal signal over a time period which ranges from a hold instruction delay timing in effect upon elapse of a second delay time following issuance of the data hold instruction to the issuance of the data transparency instruction and which includes the internal transparency end timing therebetween. The delay latch circuit still further includes a data hold portion configured to output an output signal generated on the basis of the delayed internal signal starting from a transparency instruction delay timing in effect upon elapse of the second delay time following issuance of the data transparency instruction until the internal transparency end timing, the data hold portion further holding and outputting the output signal at the internal transparency end timing, starting from the internal transparency end timing until the transparency instruction delay timing. This structure provides the effect of delaying the output of the internal signal over the time period which ranges from the hold instruction delay timing to the issuance of the data transparency instruction and which includes the internal transparency end timing therebetween.

Preferably, the internal signal output circuit may output as the internal signal a result from performing a NOR operation on a clock signal for issuing either the data transparency instruction or the data hold instruction and on the data signal. This structure provides the effect of outputting as the output signal the result from performing the NOR operation on the clock signal and data signal.

Preferably, the data hold portion may include: a feedback signal output circuit configured to output as a feedback signal a result from performing a NOR operation on an inverted signal of the clock signal and on the output signal; and a signal output circuit configured to output as the output signal a result from performing a NOR operation on the internal signal and the feedback signal. This structure provides the effect of outputting as the feedback signal the result from performing the NOR operation on the inverted signal of the clock signal and on the output signal, and of outputting as the output signal the result from performing the NOR operation on the internal signal and feedback signal.

Preferably, the data hold portion may output as the output signal a result from performing an AND operation on the OR of the clock signal and the output signal and on the internal signal. This structure provides the effect of outputting as the output signal the result from performing the AND operation on the OR of the clock signal and output signal and on the internal signal.

Preferably, the data hold portion may output as the output signal a result from performing a NAND operation on the OR of the clock signal and the inverted output signal and on the internal signal. This structure provides the effect of outputting as the output signal the result from performing the NAND operation on the OR of the clock signal and inverted output signal and on the internal signal.

Preferably, the internal signal output circuit may output as the internal signal a signal generated by performing a NAND operation on a clock signal for issuing either the data transparency instruction or the data hold instruction and on the data signal. This structure provides the effect of outputting as the output signal the result from performing the NAND operation on the clock signal and data signal.

Preferably, the data hold portion may include: a feedback signal output circuit configured to output as a feedback signal a result from performing a NAND operation on an inverted signal of the clock signal and on the output signal; and a signal output circuit configured to output as the output signal a result from performing a NAND operation on the internal signal and the feedback signal. This structure provides the effect of outputting as the feedback signal the result from performing the NAND operation on the inverted signal of the clock signal and on the output signal, and of outputting as the output signal the result from performing the NAND operation on the internal signal and feedback signal.

Preferably, the data hold portion may output as the output signal a result from performing a NAND operation on the OR of the clock signal and the inverted output signal and on the internal signal. This structure provides the effect of outputting as the output signal the result from performing the NAND operation on the OR of the clock signal and inverted output signal and on the internal signal.

Preferably, the data hold portion may output as the output signal a result from performing a NAND operation on the OR of the clock signal and the output signal and on the internal signal. This structure provides the effect of outputting as the output signal the result from performing the NAND operation on the OR of the clock signal and output signal and on the internal signal.

According to another embodiment of the present disclosure, there is provided a delay flip-flop including: a first delay latch circuit including a first internal signal output circuit configured to output, based on a clock signal for issuing either a data transparency instruction or a data hold instruction, an inverted signal of a data signal as a first internal signal starting from a first internal transparency start timing in effect upon elapse of a first delay time following issuance of the data transparency instruction until a first internal transparency end timing in effect upon elapse of the first delay time following issuance of the data hold instruction, the first internal signal output circuit further outputting a fixed value signal as the first internal signal starting from the first internal transparency end timing until the first internal transparency start timing. The first delay latch circuit further includes a first transistor configured to delay, based on an inverted signal of the clock signal, the output first internal signal over a time period which ranges from a first hold instruction delay timing in effect upon elapse of a second delay time following issuance of the data hold instruction to the issuance of the data transparency instruction and which includes the first internal transparency end timing therebetween. The first delay latch circuit still further includes a first data hold portion configured to output as a first output signal an inverted signal of the delayed first internal signal starting from a first transparency instruction delay timing in effect upon elapse of the second delay time following issuance of the data transparency instruction until the first internal transparency end timing, the first data hold portion further holding and outputting the first output signal output at the first internal transparency end timing, starting from the first internal transparency end timing until the first transparency instruction delay timing. The delay flip-flop further includes a first inversion portion configured to invert the first output signal so as to output an inverted output signal. The delay flip-flop still further includes a second delay latch circuit including a second internal signal output circuit configured to output, based on the clock signal, an inverted signal of the inverted output signal as a second internal signal starting from a second internal transparency start timing in effect upon elapse of a third delay time following issuance of the data transparency instruction until a second internal transparency end timing in effect upon elapse of the third delay time following issuance of the data hold instruction, the second internal signal output circuit further outputting a fixed value signal as the second internal signal starting from the second internal transparency end timing until the second internal transparency start timing. The second delay latch circuit further includes a second transistor configured to delay, based on an inverted signal of the clock signal, the output second internal signal over a time period which ranges from a second hold instruction delay timing in effect upon elapse of a fourth delay time following issuance of the data hold instruction to the issuance of the data transparency instruction and which includes the second internal transparency end timing therebetween. The second delay latch circuit still further includes and a second data hold portion configured to output as a second output signal an inverted signal of the delayed second internal signal starting from a second transparency instruction delay timing in effect upon elapse of the fourth delay time following issuance of the data transparency instruction until the second internal transparency end timing, the second data hold portion further holding and outputting the second output signal output at the second internal transparency end timing, starting from the second internal transparency end timing until the second transparency instruction delay timing. The delay flip-flop even further includes a second inversion portion configured to invert the second output signal. This structure provides the effect of delaying the output of the first internal signal over the time period which ranges from the first hold instruction delay timing to the issuance of the data transparency instruction and which includes the first internal transparency end timing therebetween, and of delaying the output of the second internal signal over the time period which ranges from the second hold instruction delay timing to the issuance of the data transparency instruction and which includes the second internal transparency end timing therebetween.

According to a further embodiment of the present disclosure, there is provided a delay flip-flop including: a first delay latch circuit including a first internal signal output circuit configured to output, based on a clock signal for issuing either a data transparency instruction or a data hold instruction, an inverted signal of a data signal as a first internal signal starting from a first internal transparency start timing in effect upon elapse of a first delay time following issuance of the data transparency instruction until a first internal transparency end timing in effect upon elapse of the first delay time following issuance of the data hold instruction, the first internal signal output circuit further outputting a fixed value signal as the first internal signal starting from the first internal transparency end timing until the first internal transparency start timing. The first delay latch circuit further includes a first transistor configured to delay, based on the clock signal, the output first internal signal over a time period which ranges from a first hold instruction delay timing in effect upon elapse of a second delay time following issuance of the data hold instruction to the issuance of the data transparency instruction and which includes the first internal transparency end timing therebetween. The first delay latch circuit still further includes a first data hold portion configured to output as a first output signal the delayed first internal signal starting from a first transparency instruction delay timing in effect upon elapse of the second delay time following issuance of the data transparency instruction until the first internal transparency end timing, the first data hold portion further holding and outputting the first output signal output at the first internal transparency end timing, starting from the first internal transparency end timing until the first transparency instruction delay timing. The delay flip-flop further includes a second delay latch circuit including a second internal signal output circuit configured to output, based on an inverted signal of the clock signal, an inverted signal of the inverted output signal as a second internal signal starting from a second internal transparency start timing in effect upon elapse of a third delay time following issuance of the data transparency instruction until a second internal transparency end timing in effect upon elapse of the third delay time following issuance of the data hold instruction, the second internal signal output circuit further outputting a fixed value signal as the second internal signal starting from the second internal transparency end timing until the second internal transparency start timing. The second delay latch circuit further includes a second transistor configured to delay, based on an inverted signal of the clock signal, the output second internal signal over a time period which ranges from a second hold instruction delay timing in effect upon elapse of a fourth delay time following issuance of the data hold instruction to the issuance of the data transparency instruction and which includes the second internal transparency end timing therebetween. The second delay latch circuit still further includes a second data hold portion configured to output as a second output signal an inverted signal of the delayed second internal signal starting from a second transparency instruction delay timing in effect upon elapse of the fourth delay time following issuance of the data transparency instruction until the second internal transparency end timing, the second data hold portion further holding and outputting the second output signal output at the second internal transparency end timing, starting from the second internal transparency end timing until the second transparency instruction delay timing. The delay flip-flop still further includes an inversion portion configured to invert the second output signal. This structure provides the effect of delaying the output of the first internal signal over the time period which ranges from the first hold instruction delay timing to the issuance of the data transparency instruction and which includes the first internal transparency end timing therebetween, and of delaying the output of the second internal signal over the time period which ranges from the second hold instruction delay timing to the issuance of the data transparency instruction and which includes the second internal transparency end timing therebetween.

According to an even further embodiment of the present disclosure, there is provided a delay flip-flop including: a first delay latch circuit including a first internal signal output circuit configured to output, based on a clock signal for issuing either a data transparency instruction or a data hold instruction, an inverted signal of a data signal as a first internal signal starting from a first internal transparency start timing in effect upon elapse of a first delay time following issuance of the data transparency instruction until a first internal transparency end timing in effect upon elapse of the first delay time following issuance of the data hold instruction, the first internal signal output circuit further outputting a fixed value signal as the first internal signal starting from the first internal transparency end timing until the first internal transparency start timing. The first delay latch circuit further includes a first transistor configured to delay, based on the clock signal, the output first internal signal over a time period which ranges from a first hold instruction delay timing in effect upon elapse of a second delay time following issuance of the data hold instruction to the issuance of the data transparency instruction and which includes the first internal transparency end timing therebetween. The first delay latch circuit still further includes a first data hold portion configured to output as a first output signal the delayed first internal signal starting from a first transparency instruction delay timing in effect upon elapse of the second delay time following issuance of the data transparency instruction until the first internal transparency end timing, the first data hold portion further holding and outputting the first output signal output at the first internal transparency end timing, starting from the first internal transparency end timing until the first transparency instruction delay timing. The delay flip-flop further includes a second delay latch circuit including a second internal signal output circuit configured to output, based on the clock signal, an inverted signal of the inverted output signal as a second internal signal starting from a second internal transparency start timing in effect upon elapse of a third delay time following issuance of the data transparency instruction until a second internal transparency end timing in effect upon elapse of the third delay time following issuance of the data hold instruction, the second internal signal output circuit further outputting a fixed value signal as the second internal signal starting from the second internal transparency end timing until the second internal transparency start timing. The second delay latch circuit further includes a second transistor configured to delay, based on the clock signal, the output second internal signal over a time period which ranges from a second hold instruction delay timing in effect upon elapse of a fourth delay time following issuance of the data hold instruction to the issuance of the data transparency instruction and which includes the second internal transparency end timing therebetween. The second delay latch circuit still further includes a second data hold portion configured to output as a second output signal an inverted signal of the delayed second internal signal starting from a second transparency instruction delay timing in effect upon elapse of the fourth delay time following issuance of the data transparency instruction until the second internal transparency end timing, the second data hold portion further holding and outputting the second output signal output at the second internal transparency end timing, starting from the second internal transparency end timing until the second transparency instruction delay timing. The delay flip-flop still further includes an inversion portion configured to invert the second output signal. This structure provides the effect of delaying the output of the first internal signal over the time period which ranges from the first hold instruction delay timing to the issuance of the data transparency instruction and which includes the first internal transparency end timing therebetween, and of delaying the output of the second internal signal over the time period which ranges from the second hold instruction delay timing to the issuance of the data transparency instruction and which includes the second internal transparency end timing therebetween.

According to the present disclosure outlined above, the D latch circuit or D flip-flop may be arranged to inhibit the increase in power consumption while preventing malfunction under low voltage conditions.

BRIEF DESCRIPTION OF THE DRAWINGS

FIG. 5 is a circuit diagram showing a typical structure of a slave D latch circuit as part of the first embodiment;

FIG. 8 is a truth table showing typical operations of the D latch circuit as part of the first embodiment;

FIG. 10 is a truth table showing typical operations of the internal signal generation portion as part of the first embodiment;

FIG. 11 is a truth table showing typical operations of the data hold portion as part of the first embodiment;

DETAILED DESCRIPTION OF THE PREFERRED EMBODIMENTS

Some preferred embodiments of the present disclosure will now be described below. The description will be given under the following headings:

1. First embodiment (D flip-flop supplemented with transistors);
2. Second embodiment (D flip-flop furnished with a NAND gate and a complex gate);
3. Third embodiment (D flip-flop furnished with a NOR gate and a complex gate);
4. Fourth embodiment (D flip-flop furnished with a NAND gate, a NOR gate and a complex gate); and
5. Fifth embodiment (D flip-flop furnished with a NOR gate, a NAND gate and a complex gate).

First Embodiment

Structure of the Sequential Circuit

Figure 1:
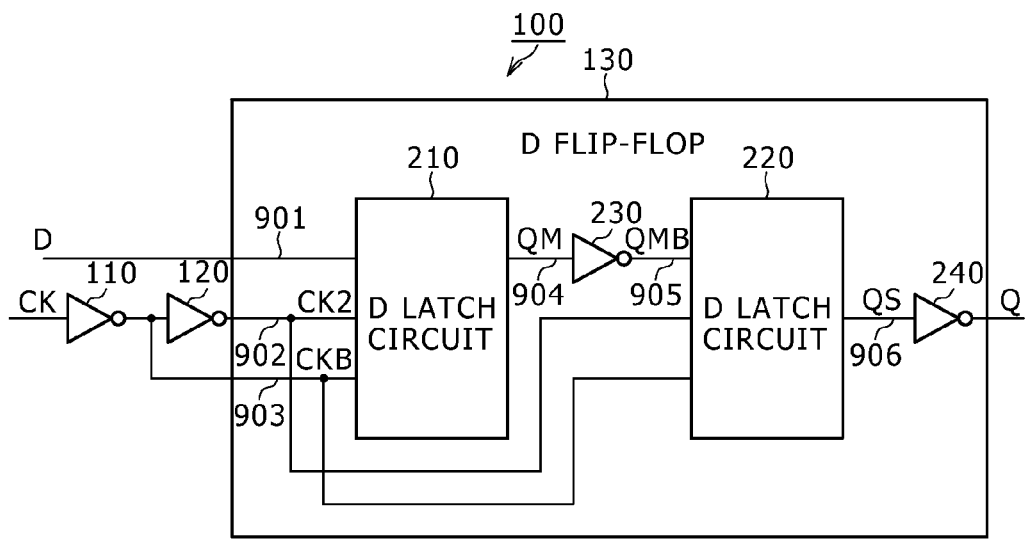
FIG. 1 is a circuit diagram showing a typical structure of a sequential circuit as a first embodiment of the present disclosure.

FIG. 1 is a circuit diagram showing a typical structure of a sequential circuit 100 as the first embodiment of the present disclosure. The sequential circuit 100 is composed of inverters 110 and 120 and a D flip-flop 130. The D flip-flop 130 includes a master D latch circuit 210, a slave D latch circuit 220, and inverters 230 and 240. A data signal D and a clock signal CK are input to the sequential circuit 100.

The data signal D is a signal that represents one-bit information. The data signal D is input to the D latch circuit 210 via a signal line 901. The clock signal CK is a signal that controls the operation of the D flip-flop 130. The D flip-flop 130 samples data at rising edge timings of the clock signal and holds the data at the other timings.

The inverter 110 inverts the clock signal CK. The inverter 110 thus inverts the clock signal CK into an inverted clock signal CKB and outputs this signal to the D latch circuits 210 and 220 via a signal line 903.

The inverter 120 further inverts the inverted clock signal CKB. The inverter 120 thus inverts the inverted clock signal CKB into a clock signal CK2 and outputs this signal to the D latch circuits 210 and 220 via a signal line 902.

The D latch circuit 210 holds data or becomes transparent to data based on the clock signal CK. Specifically, the D latch circuit 210 performs predetermined logical operations on the clock signal CK2, inverted clock signal CKB, and data signal D. The logical operations will be discussed later in detail. If the clock signal CK is High as a result of a logical operation, the D latch circuit 210 holds the data signal D while outputting the data signal D as an output signal QM to the inverter 230 via a signal line 904. If the clock signal CK is Low, the D latch circuit 210 becomes transparent to the data signal D and outputs this signal as the output signal QM to the inverter 230 via the signal line 904.

The inverter 230 inverts the output signal QM. The inverter 230 thus inverts the output signal QM into an inverted output signal QMB and outputs this signal to the D latch circuit 220 via a signal line 905.

The D latch circuit 220 holds data or becomes transparent to data based on the clock signal CK. Specifically, the D latch circuit 220 performs predetermined logical operations on the clock signal CK2, inverted clock signal CKB, and inverted output signal QMB. The logical operations will be discussed later in detail. If the clock signal CK is Low as a result of a logical operation, the D latch circuit 210 holds the inverted output signal QMB while outputting the inverted output signal QMB as an output signal QS to the inverter 240 via a signal line 906. If the clock signal CK is High, the D latch circuit 210 becomes transparent to the inverted output signal QMB and outputs this signal as the output signal QS to the inverter 240 via the signal line 906.

The inverter 240 inverts the output signal QS. The inverter 240 outputs the inverted output signal QS as an output signal Q of the D flip-flop 130.

As explained above, if the clock signal CK is Low, the master D latch circuit 210 becomes transparent to the data while the slave D latch circuit 220 holds the data. If the clock signal CK is High, the master D latch circuit 210 holds the data while the slave D latch circuit 220 becomes transparent to the data. Thus the D flip-flop 130 samples the data at rising edge timings of the clock signal and holds the data at the other timings.

Incidentally, the D flip-flop 130 is an example of the delay flip-flop described in the appended claims; the D latch circuit 210 is an example of the first delay latch circuit described in the appended claims; the D latch circuit 220 is an example of the second delay latch circuit described in the appended claims; the inverter 230 is an example of the first inversion portion described in the appended claims; and the inverter 240 is an example of the second inversion portion described in the appended claims.

Structure of the D Latch Circuit

Figure 2:
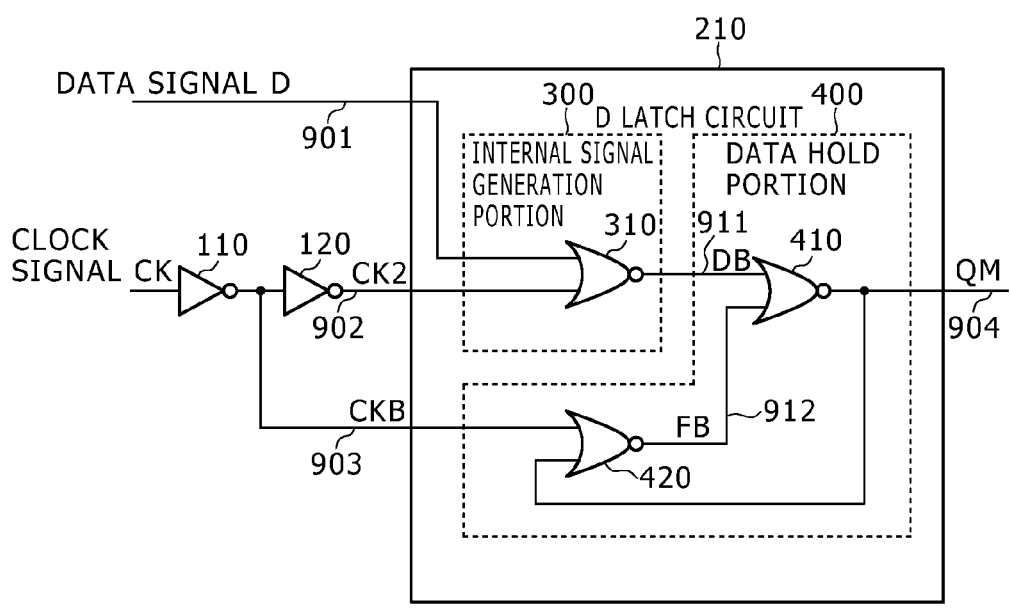
FIG. 2 is a circuit diagram showing a typical structure of a master D latch circuit as part of the first embodiment.

FIG. 2 is a circuit diagram showing a typical structure of the master D latch circuit 210 as part of the first embodiment. The D latch circuit 210 includes an internal signal generation portion 300 and a data hold portion 400.

The internal signal generation portion 300 outputs an inverted signal of the data signal D as an internal signal DB when becoming transparent to data, and outputs a fixed value signal as the internal signal DB when holding data. The internal signal generation portion 300 includes a NOR (negative logical add) gate 310.

The data hold portion 400 outputs the data signal D as the output signal QM when becoming transparent to data, and holds and outputs the immediately preceding output signal QM when holding data. The data hold portion 400 includes NOR gates 410 and 420.

The NOR gate 310 performs a NOR operation on the data signal D and clock signal CK2. The NOR gate 310 outputs the result of the NOR operation as the internal signal DB to the NOR gate 410 via a signal line 911. At the timing of the transition of the clock signal CK, the timing at which to start outputting the internal signal DB whose value varies with the transition is delayed. That is because the clock signal CK needs to pass through the inverters 110 and 120 as well as the NOR gate 310.

The NOR gate 420 performs a NOR operation on the inverted clock signal CKB and output signal QM. The NOR gate 420 outputs the result of the NOR operation as a feedback signal FB to the NOR gate 410 via a signal line 912. At the timing of the transition of the clock signal CK, the timing at which to start outputting the feedback signal FB whose value varies with the transition is delayed. That is because the clock signal CK needs to pass through the inverter 110 and NOR gate 420.

The NOR gate 410 performs a NOR operation on the internal signal DB and feedback signal FB. The NOR gate 410 outputs the result of the NOR operation as the output signal QM to the inverter 230 and NOR gate 420.

Explained below is what takes place when the clock signal CK is Low, i.e., when the circuit becomes transparent to data. In this case, the clock signal CK2 also goes Low, so that the NOR of the clock signal CK2 and data signal D gives the inverted value of the data signal D. Thus the inverted signal of the data signal D is output from the NOR gate 310 as the internal signal DB. Meanwhile, the inverted clock signal CKB goes High, so that the NOR of the inverted clock signal CKB and output signal QM goes Low regardless of the value of the output signal QM. Thus a Low fixed signal is output from the NOR gate 420 as the feedback signal DB. The NOR of the Low feedback signal FB and internal signal DB gives the inverted value of the internal signal DB. Thus the inverted signal of the internal signal DB is output from the NOR gate 410 as the output signal QM. As a result, the circuit becomes transparent to the data signal D and outputs this signal as the output signal QM.

Explained next is what takes place when the clock signal CK is High, i.e., when data is held. In this case, the clock signal CK2 also goes High, so that the NOR of the clock signal CK2 and data signal D goes Low regardless of the value of the data signal D. Thus a Low fixed signal is output from the NOR gate 310 as the internal signal DB. Meanwhile, the inverted clock signal CKB goes Low, so that the NOR of the inverted clock signal CKB and output signal QM gives the inverted value of the output signal QM. Thus the inverted signal of the immediately preceding output signal QM is output from the NOR gate 420 as the feedback signal FB. The NOR of the Low internal signal DB and feedback signal FB gives the inverted value of the feedback signal FB. Thus the inverted feedback signal FB is output from the NOR gate 410 as the output signal QM. As a result, a loop formed by the NOR gates 410 and 420 holds and outputs the immediately preceding output signal QM.

Figure 3:
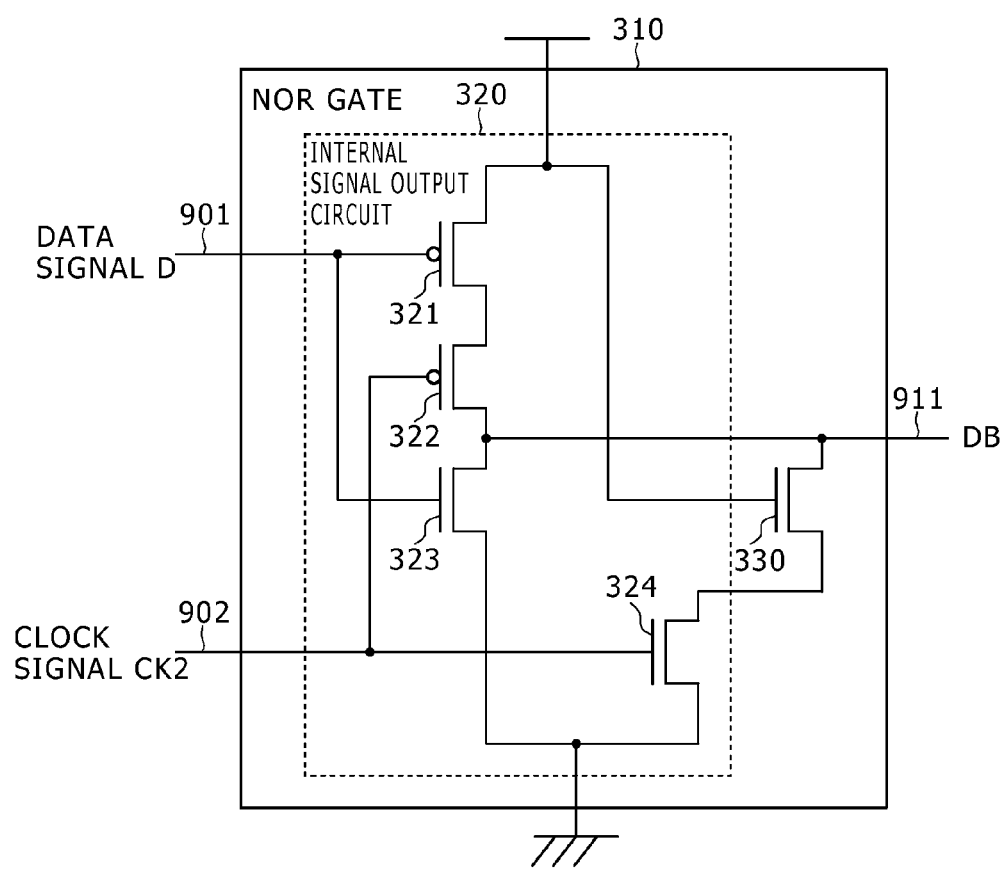
FIG. 3 is a circuit diagram showing a typical structure of a NOR gate included in a master internal signal generation portion as part of the first embodiment.

FIG. 3 is a circuit diagram showing a typical structure of the NOR gate 310 included in the master internal signal generation portion 300 as part of the first embodiment. The NOR gate 310 includes an internal signal output circuit 320 and an nMOS transistor 330. The internal signal output circuit 320 includes pMOS transistors 321 and 322 as well as nMOS transistors 323 and 324.

The pMOS transistors 321 and 322 allow current to flow between the source and the drain when the gate voltage is Low. The signal line 901 transmitting the data signal D is connected to the gate terminal of the pMOS transistor 321. The source terminal of the pMOS transistor 321 is connected to a power source, and the drain terminal of the pMOS transistor 321 is connected to the source terminal of the pMOS transistor 322. The signal line 902 transmitting the clock signal CK2 is connected to the gate terminal of the pMOS transistor 322. The source terminal of the pMOS transistor 322 is connected to the drain terminal of the pMOS transistor 321, and the drain terminal of the pMOS transistor 322 is connected to the signal line 911 transmitting the internal signal DB.

The nMOS transistors 323, 324 and 330 allow current to flow between the source and the drain when the gate voltage is High. The signal line 901 transmitting the data signal D is connected to the gate terminal of the nMOS transistor 323. The drain terminal of the nMOS transistor 323 is connected to the signal line 911 transmitting the internal signal DB, and the source terminal of the nMOS transistor 323 is grounded. The signal line 902 transmitting the clock signal CK2 is connected to the gate terminal of the nMOS transistor 324. The drain terminal of the nMOS transistor 324 is connected to the source terminal of the nMOS transistor 330, and the source terminal of the nMOS transistor 324 is grounded. The power source is connected to the gate terminal of the nMOS transistor 330. The drain terminal of the nMOS transistor 330 is connected to the signal line 911 transmitting the internal signal DB, and the source terminal of the nMOS transistor 330 is connected to the drain terminal of the nMOS transistor 324.

Consider the case where the data signal D and clock signal CK2 are Low. The Low data signal D entering the gate terminal turns on the pMOS transistor 321 and turns off the nMOS transistor 323. Also, the Low clock signal CK2 entering the gate terminal turns on the pMOS transistor 322 and turns off the nMOS transistor 324. Because the source terminal of the nMOS transistor 330 is connected to the nMOS transistor 324 being turned off, the nMOS transistor 330 is also turned off. Because the pMOS transistor 321 and 322 are both turned on, the High internal signal DB is output.

If at least one of the data signal D and clock signal CK2 goes High, then at least one of the pMOS transistors 321 and 322 in totem pole connection is turned off. Also, the High data signal D entering the gate terminal turns on the nMOS transistor 323. The High clock signal CK2 entering the gate terminal turns on the nMOS transistor 324, and the nMOS transistor 330 connected to the drain terminal of the nMOS transistor 324 is also turned on. Thus if at least one of the data signal D and clock signal CK2 goes High, the Low internal signal DB is output. As a result, the NOR of the data signal D and clock signal CK2 is output as the internal signal DB.

When data is held, i.e., when the clock signal CK2 goes from Low to High, the value of the internal signal DB may vary with the transition of the clock signal CK2. Specifically, consider the transition from the state where the data signal D and clock signal CK2 are both Low to the state where the data signal D remains Low whereas the clock signal CK2 goes High. When the data signal D and clock signal CK2 are both Low, the High internal signal DB is output as described above. When the clock signal CK2 goes High in that state, the High clock signal CK2 entering the gate terminal turns on the nMOS transistor 324. The nMOS transistor 330 connected to the nMOS transistor 324 is also turned on. As a result, the Low internal signal DB is output from the signal line 911 connected to the drain terminal of the pMOS transistor 322. If the nMOS transistors 324 and 330 are not active, the internal signal DB does not go Low. Thus the delay from the time the clock signal CK2 goes High until the internal signal DB goes Low is longer than if the nMOS transistor 330 is not provided.

Figure 4:
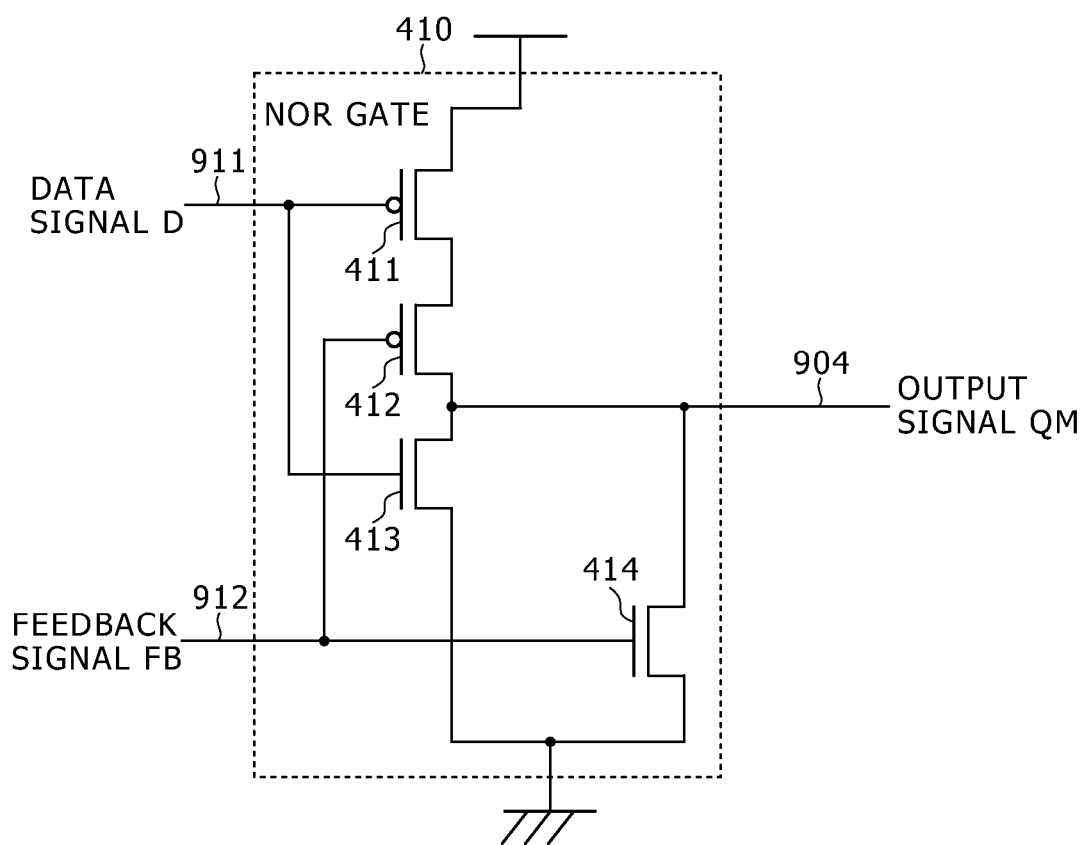
FIG. 4 is a circuit diagram showing a typical structure of a NOR gate included in a master data hold portion as part of the first embodiment.

FIG. 4 is a circuit diagram showing a typical structure of the NOR gate 410 included in the master data hold portion 400 as part of the first embodiment. The NOR gate 410 includes pMOS transistors 411 and 412 as well as nMOS transistors 413 and 414.

The structures of the pMOS transistors 411 and 412 in FIG. 4 are substantially the same as those of the pMOS transistors 321 and 322 shown in FIG. 3. The structure of the nMOS transistor 413 in FIG. 4 is substantially the same as that of the nMOS transistor 323 shown in FIG. 3. The structure of the nMOS transistor 414 in FIG. 4 is substantially the same as that of the nMOS transistor 324 shown in FIG. 3 except that the drain terminal is connected to the signal line 904 transmitting the output signal QM. That is, the structure of the NOR gate 410 in FIG. 4 is substantially the same as that of the NOR gate 310 in FIG. 3 excluding the nMOS transistor 330. The structure of the NOR gate 420 is substantially the same as that of the NOR gate 410.

If the internal signal DB and feedback signal FB are Low in the NOR gate 410, the input of the Low internal signal DB turns on the pMOS transistor 411 and turns off the nMOS transistor 413. Also, the Low feedback signal FB entering the gate terminal turns on the pMOS transistor 412 and turns off the nMOS transistor 414. Because the pMOS transistors 411 and 412 are both turned on, the High internal signal DB is output from the signal line 904 connected to the drain terminal of the pMOS transistor 412.

If at least one of the internal signal DB and feedback signal FB goes High, at least one of the pMOS transistors 411 and 412 in totem pole connection is turned off. Also, at least one of the nMOS transistors 413 and 414 is turned on. Thus if at least one of the internal signal DB and feedback signal FB goes High, the Low internal signal DB is output. As a result, the NOR of the internal signal DB and feedback signal FB is output as the internal signal DB.

FIG. 5 is a circuit diagram showing a typical structure of the slave D latch circuit 220 as part of the first embodiment. The D latch circuit 220 includes an internal signal generation portion 301 and a data hold portion 401.

The internal signal generation portion 301 outputs the inverted signal of the inverted output signal QMB as the internal signal DB when becoming transparent to data, and outputs a fixed value signal as the internal signal DB when holding data. The internal signal generation portion 301 includes a NAND (nonconjunction) gate 340.

The data hold portion 401 outputs the inverted output signal QMB as the output signal QS when becoming transparent to data, and holds and outputs the immediately preceding output signal QS when holding data. The data hold portion 401 includes NAND gates 430 and 440.

The NAND gate 340 performs a NAND operation on the inverted output signal QMB and clock signal CK2. The NAND gate 340 outputs the result of the NAND operation as the internal signal DB to the NAND gate 430 via a signal line 913. At the timing of the transition of the clock signal CK, the timing at which to start outputting the internal DB whose value varies with the transition is delayed. That is because the clock signal CK needs to pass through the inverters 110 and 120 as well as the NAND gate 340.

The NAND gate 440 performs a NAND operation on the inverted clock signal CKB and output signal QS. The NAND gate 440 outputs the result of the NAND operation as the feedback signal FB to the NAND gate 430 via the signal line 914. At the timing of the transition of the clock signal CK, the timing at which to start outputting feedback signal FB whose value varies with the transition is delayed. That is because the clock signal CK needs to pass through the inverter 110 and NAND gate 440.

The NAND gate 430 performs a NAND operation on the internal signal DB and feedback signal FB. The NAND gate 430 outputs the result of the NAND operation as the output signal QS to the inverter 240 and NAND gate 440.

Explained next is what takes place when the clock signal CK is High, i.e., when the circuit becomes transparent to data. In this case, the clock signal CK2 also goes High, so that the NAND of the clock signal CK2 and inverted output signal QMB gives the inverted value of the inverted output signal QMB. Thus the inverted signal of the inverted output signal QMB is output from the NAND gate 340 as the internal signal DB. Meanwhile, the inverted clock signal CKB goes Low, so that the NAND of the inverted clock signal CKB and output signal QS goes High regardless of the value of the output signal QS. Thus a High fixed signal is output from the NAND gate 440 as the feedback signal FB. The NAND of the High feedback signal FB and internal signal DB gives the inverted value of the internal signal DB. Thus the inverted internal signal DB is output from the NAND gate 430 as the output signal QS. As a result, the circuit becomes transparent to the inverted output signal QMB and outputs this signal as the output signal QS.

Explained next is what takes place when the clock signal CK is Low, i.e., when data is held. In this case, the clock signal CK2 also goes Low, so that the NAND of the clock signal CK2 and inverted output signal QMB goes High regardless of the value of the inverted output signal QMB. Thus a High fixed signal is output from the NAND gate 340 as the internal signal DB. Meanwhile, the inverted clock signal CKB goes High, so that the NAND of the inverted clock signal CKB and output signal QS gives the inverted value of the output signal QS. Thus the inverted signal of the immediately preceding output signal QS is output from the NAND gate 440 as the feedback signal FB. The NAND of the High internal signal DB and feedback signal FB gives the inverted value of the feedback signal FB. Thus the inverted feedback signal FB is output from the NAND gate 430 as the output signal QS. As a result, a loop formed by the NAND gates 430 and 440 holds and outputs the immediately preceding output signal QS.

Figure 6:
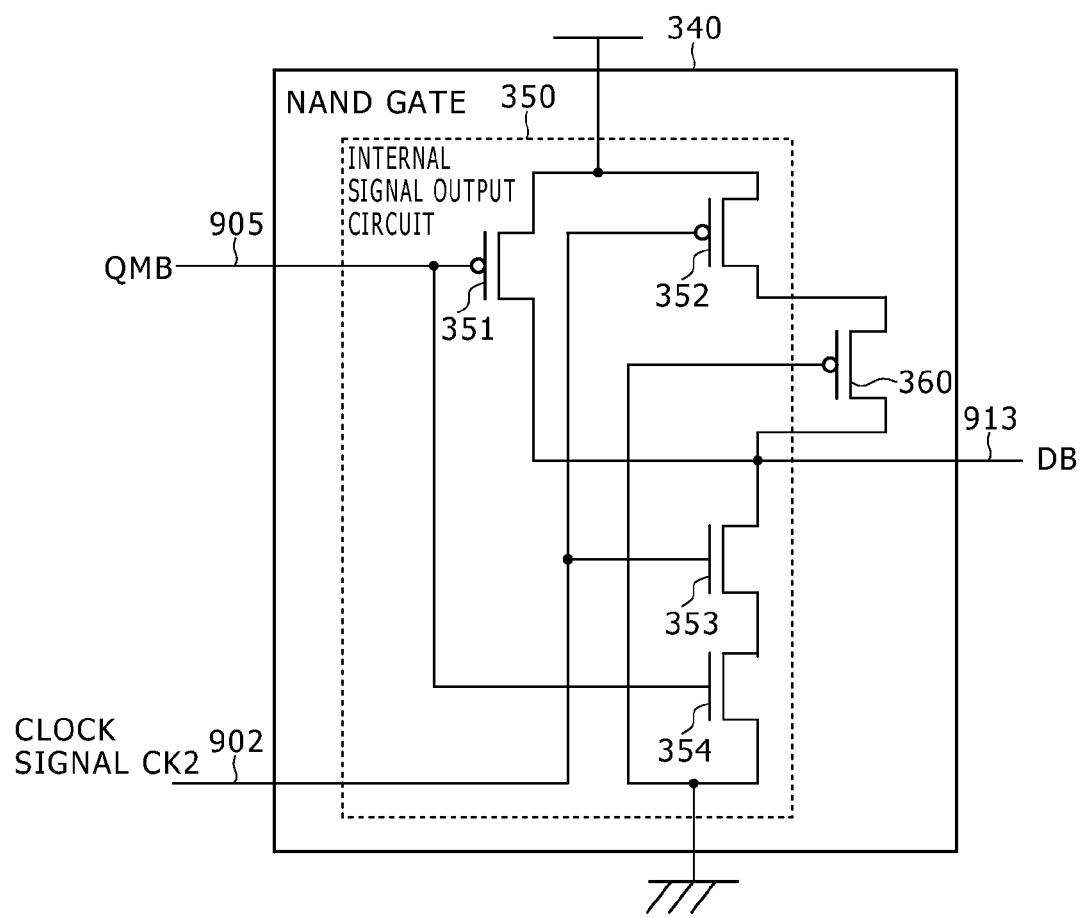
FIG. 6 is a circuit diagram showing a typical structure of a NAND gate included in a slave internal signal generation portion as part of the first embodiment.

FIG. 6 is a circuit diagram showing a typical structure of the NAND gate 340 included in the slave internal signal generation portion 301 as part of the first embodiment. The NAND gate 340 includes an internal signal output circuit 350 and a pMOS transistor 360. The internal signal output circuit 350 includes pMOS transistors 351 and 352 as well as nMOS transistors 353 and 354.

The pMOS transistors 351, 352 and 360 allow current to flow between the source and the drain when the gate voltage is Low. The signal line 905 transmitting the inverted output signal QMB is connected to the gate terminal of the pMOS transistor 351. The source terminal of the pMOS transistor 351 is connected to the power source, and the drain terminal of the pMOS transistor 351 is connected to the signal line 913 transmitting the internal signal DB. The signal line 902 transmitting the clock signal CK2 is connected to the gate terminal of the pMOS transistor 352. The source terminal of the pMOS transistor 352 is connected to the power source, and the drain terminal of the pMOS transistor 352 is connected to the source terminal of the pMOS transistor 360. The gate terminal of the pMOS transistor 360 is grounded. The source terminal of the pMOS transistor 360 is connected to the drain terminal of the pMOS transistor 352, and the drain terminal of the pMOS transistor 360 is connected to the signal line 913 transmitting the internal signal DB.

The nMOS transistors 353 and 354 allow current to flow between the source and the drain when the gate voltage is High. The signal line 902 transmitting the clock signal CK2 is connected to the gate terminal of the nMOS transistor 353. The drain terminal of the nMOS transistor 353 is connected to the signal line 913 transmitting the internal signal DB, and the source terminal of the nMOS transistor 353 is connected to the drain terminal of the nMOS transistor 354. The signal line 905 transmitting the inverted output signal QMB is connected to the gate terminal of the nMOS transistor 354. The drain terminal of the nMOS transistor 354 is connected to the source terminal of the nMOS transistor 353, and the source terminal of the nMOS transistor 354 is grounded.

Consider the case where the inverted output signal QMB and clock signal CK2 are High. The High inverted output signal QMB entering the gate terminal turns off the pMOS transistor 351 and turns on the nMOS transistor 354. Also, the High clock signal CK2 entering the gate terminal turns off the pMOS transistor 352 and turns on the nMOS transistor 353. Because the source terminal of the pMOS transistor 360 is connected to the pMOS transistor 352 being turned off, the pMOS transistor 360 is also turned off. Because the nMOS transistors 353 and 354 are turned on and the pMOS transistors 351 and 360 are turned off, the Low internal signal DB is output.

If at least one of the inverted output signal QMB and clock signal CK2 goes Low, at least one of the nMOS transistors 353 and 354 in totem pole connection is turned off. Also, the Low inverted output signal QMB entering the gate terminal turns on the pMOS transistor 351. The Low clock signal CK2 entering the gate terminal turns on the pMOS transistor 352, and the pMOS transistor 360 connected to the drain terminal of the pMOS transistor 352 is also turned on. Thus if at least one of the inverted output signal QMB and clock signal CK2 goes Low, the High internal signal DB is output. As a result, the NAND of the inverted output signal QMB and clock signal CK2 is output as the internal signal DB.

When data is held, i.e., when the clock signal CK2 goes from High to Low, the value of the internal signal DB may vary with the transition of the clock signal CK2. Specifically, consider the transition from the state where the inverted output signal QMB and clock signal CK2 are both High to the state where the inverted output signal QMB remains High whereas the clock signal CK2 goes Low. When the inverted output signal QMB and clock signal CK2 are both High, the Low internal signal DB is output as explained above. When the clock signal CK2 goes Low in that state, the Low clock signal CK2 entering the gate terminal turns on the pMOS transistor 352. The pMOS transistor 360 connected to the source terminal of the pMOS transistor 352 is also turned on. As a result, the High internal signal DB is output from the signal line 911 connected to the drain terminal of the pMOS transistor 360. If the pMOS transistors 352 and 360 are not active, the internal signal DB does not go High. Thus the delay from the time the clock signal CK2 goes Low until the internal signal DB goes High is longer than if the pMOS transistor 360 is not provided.

Figure 7:
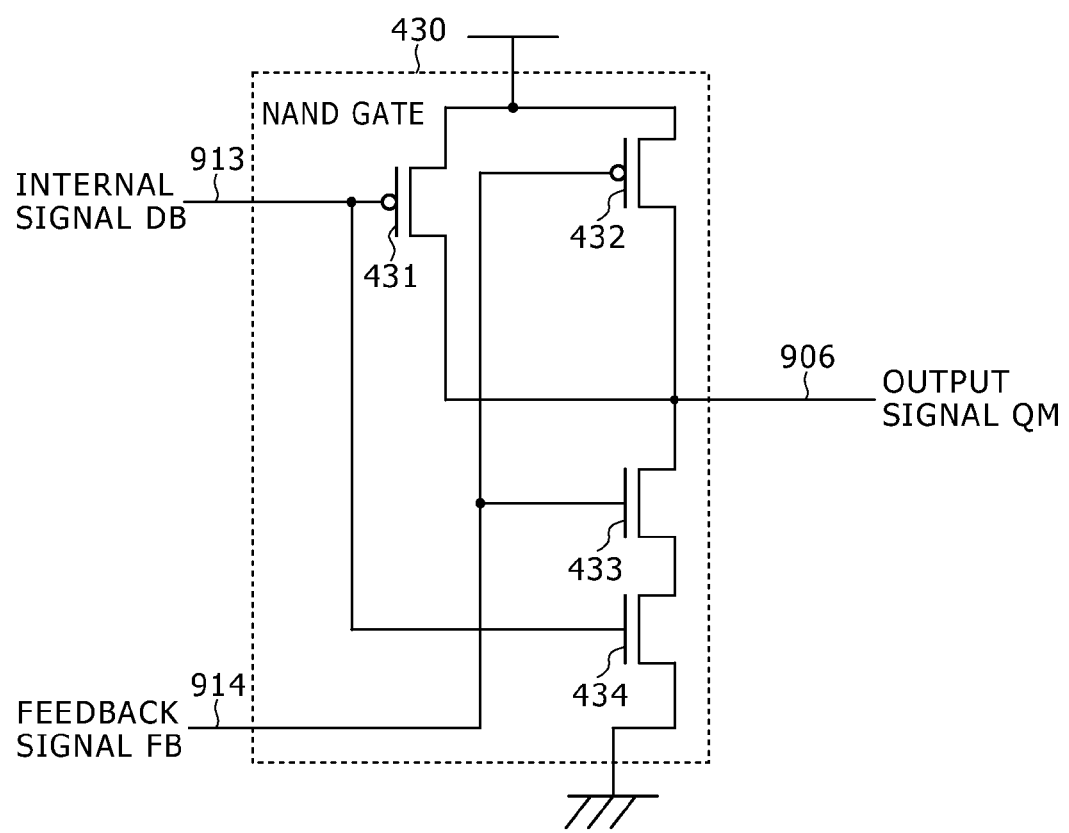
FIG. 7 is a circuit diagram showing a typical structure of a NAND gate included in a slave data hold portion as part of the first embodiment.

FIG. 7 is a circuit diagram showing a typical structure of the NAND gate 430 included in the slave data hold portion 401 as part of the first embodiment. The NAND gate 430 includes pMOS transistors 431 and 432 as well as nMOS transistors 433 and 434.

The structure of the pMOS transistor 431 in FIG. 7 is substantially the same as that of the pMOS transistor 351 shown in FIG. 6. The structure of the pMOS transistor 432 in FIG. 7 is substantially the same as that of the pMOS transistor 352 shown in FIG. 6 except that the drain terminal is connected to the signal line 906 transmitting the output signal QS. The structures of the nMOS transistors 433 and 434 in FIG. 7 are substantially the same as those of the nMOS transistors 353 and 354 shown in FIG. 6. That is, the structure of the NAND gate 430 in FIG. 7 is substantially the same as that of the NAND gate 340 in FIG. 6 excluding the pMOS transistor 360. The structure of the NAND gate 440 is substantially the same as that of the NAND gate 430.

Consider the case where the internal signal DB and feedback signal FB are both High in the NAND gate 430. The High internal signal DB entering the gate terminal turns off the pMOS transistor 431 and turns on the nMOS transistor 434. Also, the High feedback signal FB entering the gate terminal turns off the pMOS transistor 432 and turns on the nMOS transistor 433. Because the nMOS transistors 433 and 434 are turned on and the pMOS transistors 431 and 432 are turned off, the Low output signal QS is output.

If at least one of the internal signal DB and feedback signal FB goes Low, at least one of the nMOS transistors 433 and 434 in totem pole connection is turned off. Also, the Low internal signal DB entering the gate terminal turns on the pMOS transistor 431. The Low feedback signal FB entering the gate terminal turns on the pMOS transistor 432. Thus if at least one of the internal signal DB and feedback signal FB goes Low, the High output signal QS is output. As a result, the NAND of the internal signal DB and feedback signal FB is output as the output signal QS.

Operations of the Sequential Circuit

How the sequential circuit 100 operates will now be explained by referring to FIGS. 8 through 12. FIG. 8 is a truth table showing typical operations of the D latch circuit 210 as part of the first embodiment. When the clock signal is Low (L), the D latch circuit 210 becomes transparent to the data signal D and outputs this signal as the output signal QM. When the clock signal is High (H), the D latch circuit 210 holds the data signal D and outputs this signal as the output signal QM at the same time.

Meanwhile, when the clock signal is Low (L), the D latch circuit 220 holds the data signal D. When the clock signal CK is High (H), the D latch circuit 220 becomes transparent to the data signal D. Because the operations of the D latch circuit 220 correspond to those of the D latch circuit 210, the ensuing description will focus on how the D latch circuit 210 operates, and the workings of the D latch circuit 220 will not be explained.

Figure 9:
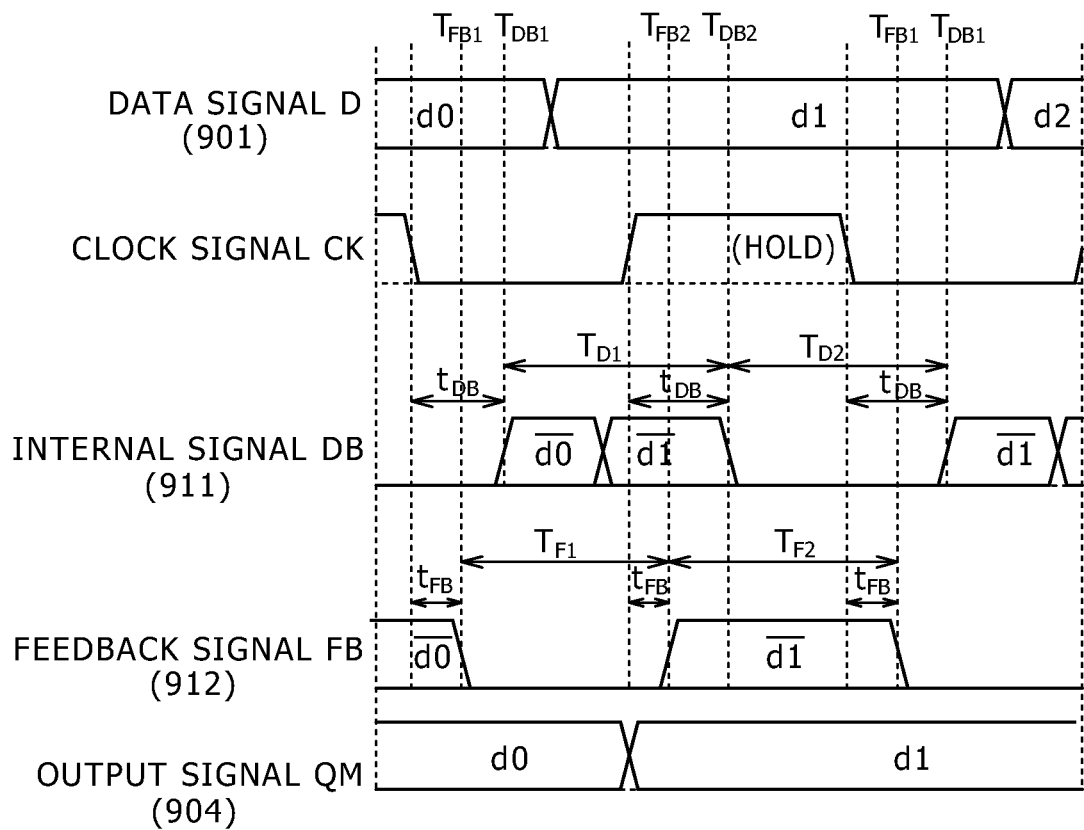
FIG. 9 is a timing chart showing typical timings of the D latch circuit as part of the first embodiment.

FIG. 9 is a timing chart showing typical timings of the D latch circuit 210 as part of the first embodiment.

As discussed above, at the timing of the transition of the clock signal CK, the timing at which to start outputting the internal signal DB in response to the transition is delayed by the amount of a gate delay between the inverters 110 and 120 on the one hand and the NOR gate 310 on the other hand. In the ensuing description, this delay time will be represented by reference characters $t_{DB}$. The timing in effect upon elapse of the delay time $t_{DB}$ from the timing at which the clock signal CK goes Low will be called an internal transparency start timing $T_{DB1}$. The timing in effect upon elapse of the delay time $t_{DB}$ from the timing at which the clock signal CK goes High will be called an internal transparency end timing $T_{DB2}$. The time period ranging from the internal transparency start timing $T_{DB1}$ to the internal transparency end timing $T_{DB2}$ will be called a time period $T_{D1}$. The time period ranging from the internal transparency end timing $T_{DB2}$ to the internal transparency start timing $T_{DB1}$ will be called a time period $T_{D2}$.

Also, at the timing of the transition of the clock signal CK, the timing at which to start outputting the feedback signal FB corresponding to the transition is delayed by the amount of a gate delay between the inverter 110 and the NOR gate 420. In the ensuing description, this delay time will be represented by reference characters $t_{FB}$. The timing in effect upon elapse of the delay time $t_{FB}$ from the timing at which the clock signal CK goes Low will be called a transparency instruction delay timing $T_{FB1}$. The timing in effect upon elapse of the delay time $t_{FB}$ from the timing at which the clock signal CK goes High will be called a hold instruction delay timing $T_{FB2}$. The time period ranging from the transparency instruction delay timing $T_{FB1}$ to the hold instruction delay timing $T_{FB2}$ will be called a time period $T_{F1}$. The time period ranging from the hold instruction delay timing $T_{FB2}$ to the transparency instruction delay timing $T_{FB1}$ will be called a time period $T_{F2}$.

How the NOR gate 310 operates will now be explained. During the time period $T_{D1}$, the NOR gate 310 outputs the inverted data signal D as the internal signal DB via the signal line 911. This is because the NOR of the Low clock signal CK2 and data signal D gives the inverted value of the data signal D.

During the time period $T_{D2}$, on the other hand, the NOR gate 310 outputs a Low signal as the internal signal DB regardless of the value of the data signal D. This is because the NOR of the High clock signal CK2 and data signal D is Low.

How the NOR gate 420 operates will be explained next. During the time period $T_{F1}$, the NOR gate 420 outputs a Low signal as the feedback signal FB via the signal line 912 regardless of the value of the immediately preceding output signal QM. This is because the NOR of the High clock signal CKB and output signal QM is Low.

During the time period $T_{F2}$, on the other hand, the NOR gate 420 outputs as the feedback signal FB the inverted signal of the immediately preceding output signal QM (more specifically, of the signal QM output at the timing of the internal transparency end timing $T_{DB2}$). This is because the NOR of the Low clock signal CKB and output signal QM gives the inverted value of the output signal QM.

How the NOR gate 410 operates will now be explained. When a Low-fixed signal is input to the NOR gate 410 as the internal signal DB at the internal transparency end timing $T_{DB2}$ a loop is formed by the NOR gates 410 and 420 bringing about the state in which data is held. Thus the internal transparency end timing $T_{DB2}$ becomes the starting point of the time period during which the data is held. On the other hand, when a Low-fixed signal is input to the NOR gate 410 as the feedback signal FB, the loop formed by the NOR gates 410 and 420 is canceled, which brings about the state in which the circuit becomes transparent to the data. Thus the transparency instruction delay timing $T_{FB1}$ becomes the end point of the time period during which the data is held. As a result, from the internal transparency end timing $T_{DB2}$ until the transparency instruction delay timing $T_{FB1}$, the NOR gate 410 holds the immediately preceding output signal QM (i.e., signal in effect at the internal transparency end timing $T_{DB2}$) and outputs this signal at the same time. Also, from the transparency instruction delay timing $T_{FB1}$ until the internal transparency end timing $T_{DB2}$, the NOR gate 410 outputs the inverted signal of the internal signal DB as the output signal QM.

FIG. 10 is a truth table showing typical operations of the internal signal generation portion 300 as part of the first embodiment. The NOR gate 310 included in the internal signal generation portion 300 outputs a Low-fixed signal as the internal signal DB from the time the clock signal CK goes Low (L) until the time period $T_{D2}$ has elapsed. From the time the time period $T_{D2}$ has elapsed until the clock signal CK goes High (H), and from the time the clock signal CK goes High until the time period $T_{D1}$ has elapsed, the NOR gate 310 outputs the inverted signal of the data signal D as the internal signal DB. Also, from the time the time period $T_{D1}$ has elapsed until the time the clock signal goes Low, the NOR gate 310 outputs a Low-fixed signal as the internal signal DB.

FIG. 11 is a truth table showing typical operations of the data hold portion 400 as part of the first embodiment. From the time the clock signal goes Low until the time the time period $T_{F2}$ has elapsed, the inverted signal of the immediately preceding output signal QM is generated as the feedback signal FB. Also during the time period $T_{F2}$, a Low-fixed signal is input to the data hold portion 400 as the internal signal DB. This causes the data hold portion 400 to form a loop, holding the immediately preceding output signal QM and outputting this signal at the same time.

From the time the time period $T_{F2}$ has elapsed until the time the clock signal CK goes High, a Low-fixed signal is generated as the feedback signal FB. Thus the data hold portion 400 does not form a loop and outputs the data signal D as the output signal QM. Also, from the time the clock signal goes High until the time the time period $T_{F1}$ has elapsed, a Low-fixed signal is generated as the feedback signal FB so that the circuit becomes transparent to data. From the time the time period $T_{F1}$ has elapsed until the time a Low-fixed signal is output as the internal signal DB, the inverted signal of the data signal D is input as the internal signal QM so that no loop is formed in the data hold portion 400. Thus the data hold portion 400 becomes transparent to the data signal D and outputs this signal as the output signal QM.

From the time the time period $T_{F2}$ has elapsed until the time the clock signal CK goes Low, the data hold portion 400 forms a loop. Thus the data hold portion 400 holds the immediately preceding output signal QM and outputs this signal at the same time.

If a Low-fixed signal is input to the data hold portion 400 as the internal signal DB from the time the clock signal CK goes High until the time period $T_{F1}$ has elapsed, the D latch circuit 210 can malfunction. This is because not the inverted signal of the immediately preceding output signal QM but a Low-fixed signal is generated as the feedback signal FB during the time period $T_{F1}$. While the Low-fixed signal is being generated as the feedback signal FB, a High signal composed of the inverted signal of the Low feedback signal FB is held as the output signal QM even if the immediately preceding output signal QM is Low.

However, as shown in FIG. 3, the nMOS transistor 330 is provided in the internal signal generation portion 300. When the clock signal CK goes High, the Low signal is not output as the internal signal DB unless the nMOS transistor 330 operates in addition to the nMOS transistor 324. With the nMOS transistor 330 thus provided, the delay time $t_{DB}$ from the time the clock signal CK goes High until the Low signal is output as the internal signal DB becomes longer than if the nMOS transistor 330 is not provided. It is assumed that the nMOS transistor 330 is selected in such a manner as to make the delay time $t_{DB}$ longer than the delay time $t_{FB}$. When the delay time $t_{DB}$ remains longer than the delay time $t_{FB}$, the internal signal generation portion 300 does not output the Low-fixed signal as the internal signal DB until the time period $T_{F1}$ has elapsed. This prevents the above-mentioned malfunction.

Figure 12:
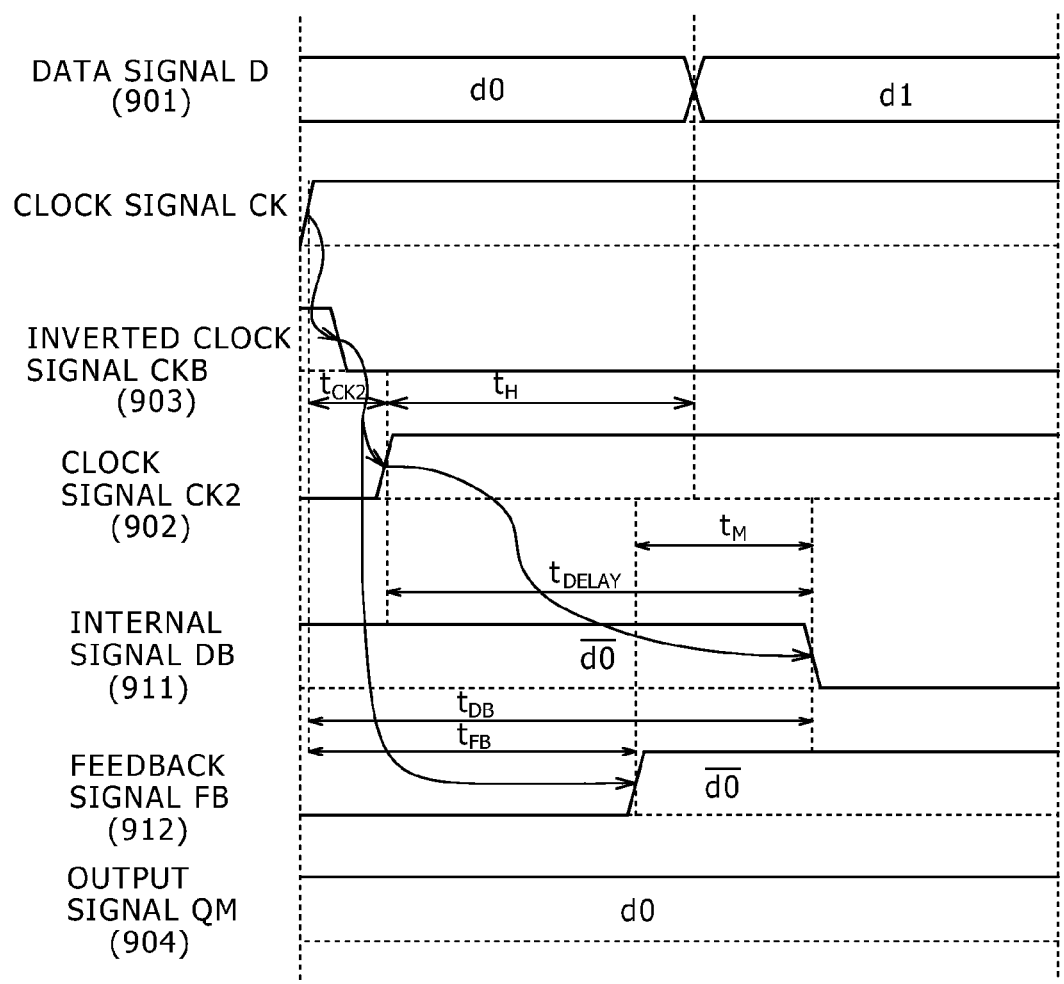
FIG. 12 is a timing chart showing typical timings of the D latch circuit holding data in the first embodiment.

FIG. 12 is a timing chart showing typical timings of the D latch circuit 210 holding data in the first embodiment.

When the clock signal CK goes High, the inverter 110 outputs the Low inverted clock signal CKB via the signal line 903.

When the Low inverted clock signal CKB is output, the inverter 120 outputs the High clock signal CK2 via the signal line 902. The time it takes the signal to pass through the inverters 110 and 120 is called a delay time $t_{CK2}$.

When the clock signal CK2 goes High, the NOR gate 310 performs a NOR operation to output a Low-fixed signal as the internal signal DB to the NOR gate 410 via the signal line 911. The time it takes the signal to pass through the NOR gate 310 is called a delay time $t_{DELAY}$.

From the time the clock signal CK goes High until the Low-fixed signal is output as the internal signal DB, there elapses the delay time $t_{DB}$ that is the sum of the delay times $t_{CK2}$ and $t_{DELAY}$.

When the Low inverted clock signal CKB is output, the NOR gate 420 performs a NOR operation to output the inverted signal of the immediately preceding output signal QM as the feedback signal FB to the NOR gate 410 via the signal line 912. There occurs the delay time $t_{FB}$ from the time the clock signal CK goes High until the inverted signal of the immediately preceding output signal QM is output as the feedback signal FB.

When a Low-fixed signal is output as the internal signal DB, the NOR gate 410 performs a NOR operation to output the inverted signal of the feedback signal FB as the output signal QM via the signal line 904.

If a Low-fixed signal in effect upon elapse of the delay time $t_{FB}$ is input as the internal signal DB to the data hold portion 400 between the time the clock signal CK goes High and the time the delay time $t_{DB}$ has elapsed, the D latch circuit 210 can malfunction. This is because the inverted signal of the immediately preceding output signal QM has yet to be output as the feedback signal FB until the delay time $t_{FB}$ elapses.

Consider the structure shown in FIG. 3 excluding the nMOS transistor 330. The delay time $t_{DB}$ stands for the gate delay between the inverters 110 and 120 on the one hand and the NOR gate 310 on the other hand, and the delay time $t_{FB}$ represents the gate delay between the inverter 110 and the NOR gate 420. Thus the delay time $t_{DB}$ is ordinarily longer than the delay time $t_{FB}$. However, different logical elements incur different delays under low voltage conditions. If the difference between the logical elements in delay time becomes considerable, the delay time $t_{DB}$ can elapse before the delay time $t_{FB}$ has yet to elapse in a circuit excluding the nMOS transistor 330.

Conceivably, the transition of the clock signal CK2 may be further delayed to prevent the delay time $t_{DB}$ from becoming shorter than the delay time $t_{FB}$. However, this arrangement is not advantageous because a hold margin $t_H$ will be shortened if the transition of the clock signal CK2 is delayed. The hold margin $t_H$ is a time period from the time the clock signal CK2 is changed until the data signal D is changed. If the hold margin $t_H$ becomes shorter, the unchanged data signal D may not be held because the data signal D can be changed before the hold state is reached upon elapse of the delay time $t_{DB}$.

Where the nMOS transistor 330 is furnished as shown in FIG. 3, the transition of the data signal DB does not take place unless the nMOS transistors 324 and 330 both operate when the data is held with the clock signal CK going High. Thus the delay time $t_{DB}$ is made longer with the nMOS transistor 330 furnished than if this transistor is not provided. As a result, the delay time $t_{DB}$ becomes longer than the delay time $t_{FB}$ by a time period $t_M$. This causes the output of the internal signal DB to be delayed in such a manner that the internal transparency end timing $T_{DB2}$ is included between the time the hold instruction delay timing $T_{FB2}$ is reached and the time the clock signal goes Low. Thus the D latch circuit 210 does not reach the hold state before the inverted signal of the immediately preceding output signal QM is generated as the feedback signal FB, whereby the malfunction of the D latch circuit 210 is prevented.

Figure 13:
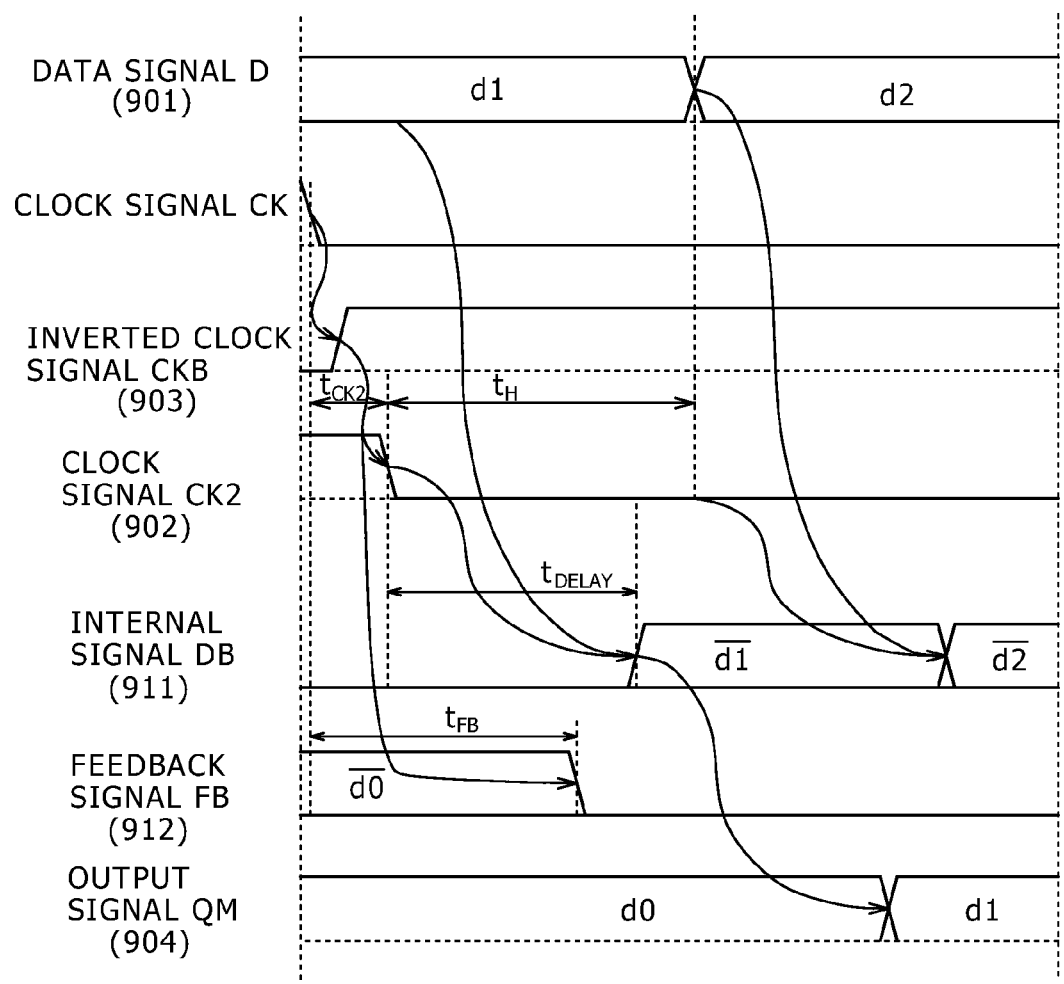
FIG. 13 is a timing chart showing typical timings of the D latch circuit becoming transparent to data in the first embodiment.

FIG. 13 is a timing chart showing typical timings of the D latch circuit 210 becoming transparent to data in the first embodiment.

When the clock signal CK goes Low, the inverter 110 outputs the High inverted clock signal CKB via the signal line 903.

When the High inverted clock signal CKB is output, the inverter 120 outputs the Low clock signal CK2 via the signal line 902.

When the clock signal CK2 goes Low, the NOR gate 310 performs a NOR operation to output the inverted data signal D as the internal signal DB to the NOR gate 410 via the signal line 911.

When the High inverted clock signal CKB is output, the NOR gate 420 performs a NOR operation to output a Low-fixed signal as the feedback signal FB to the NOR gate 410 via the signal line 912.

When the Low-fixed signal is output as the feedback signal FB, the NOR gate 410 performs a NOR operation to output the inverted signal of the internal signal DB as the output signal QM via the signal line 904.

The operations of the master D latch circuit 210 have been explained above in reference to FIGS. 8 through 13. The operations of the slave D latch circuit 220 are substantially the same as those of the master D latch circuit 210 except that the polarity of the clock signal CK and that of the signal being held are inverted.

According to the first embodiment of the present disclosure described above, the nMOS transistor 330 and pMOS transistor 360 delay the output of the internal signal DB. Thus before the inverted signal of the immediately preceding output signal QM is generated as the feedback signal FB, the D latch circuits 210 and 220 do not reach the hold state, so that the malfunction of the D latch circuits 210 and 220 under low voltage conditions is prevented. Because a single nMOS transistor 330 need only be furnished for the purpose, the size of the gate is not enlarged and the increase in power consumption is minimized. Since there is no need to delay the clock signal CK2, a sufficient hold margin $T_H$ may be provided.

The master D latch circuit 210 is furnished with the NOR gates 310, 410 and 420. Because this structure does not use a wired OR circuit, the malfunction of the circuit under low voltage conditions is prevented. Since the gate size with this circuit is smaller than the D latch circuit equipped with four NAND gates discussed in Non-Patent Document 2, power consumption can be reduced. This provides a D latch circuit that can reduce power consumption while preventing malfunction under low voltage conditions.

The slave D latch circuit 220 includes the NAND gates 340, 430 and 440. Because no wired OR circuit is used and because the gate size is correspondingly small, this structure provides a D latch circuit that can reduce power consumption while preventing malfunction under low voltage conditions.

Where the D latch circuits 210 and 220 are used to constitute the D flip-flop structure as described, it is possible to implement the D flip-flop that reduces power consumption while preventing malfunction under low voltage conditions.

Although the foregoing description showed the D latch circuit 210 to be the master and the D latch circuit 220 to be the slave, this is not limitative of the present disclosure. Alternatively, the two circuits may be switched in their roles so that the D latch circuit 210 may be the slave and the D latch circuit 220 may be the master. The alternative structure constitutes a D flip-flop that samples data not at rising edges but at falling edges.

FIG. 3 shows the D latch circuit 210 furnished with the NOR gate. Alternatively, the nMOS transistor 330 may be installed in a D latch circuit other than that shown in FIG. 3 as long as the output of the internal signal DB can be delayed when data is held.

FIG. 5 shows the D latch circuit 220 furnished with the NAND gates. Alternatively, the pMOS transistor 360 may be installed in a D latch circuit other than that shown in FIG. 5 as long as the output of the internal signal DB can be delayed when data is held.

Also, the nMOS transistor 330 may be positioned elsewhere other than the location shown in FIG. 3 as long as the output of the internal signal DB can be delayed when data is held. Likewise, the pMOS transistor 360 may be positioned elsewhere other than the location shown in FIG. 6 as long as the output of the internal signal DB can be delayed when data is held.

2. Second Embodiment

Structure of the Sequential Circuit

Figure 14:
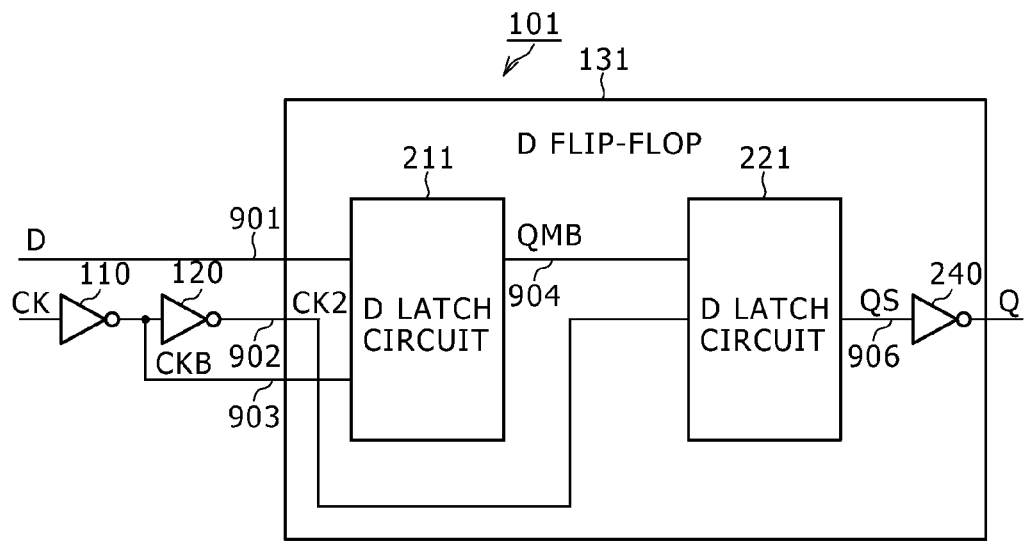
FIG. 14 is a circuit diagram showing a typical structure of a sequential circuit as a second embodiment of the present disclosure.

FIG. 14 is a circuit diagram showing a typical structure of a sequential circuit 101 as the second embodiment of the present disclosure. The structure of the sequential circuit 101 is substantially the same as that of the sequential circuit 100 of the first embodiment except that a D flip-flop 131 replaces the D flip-flop 130. The D flip-flop 131 is made up of a master D latch circuit 211, a slave D latch circuit 221, and an inverter 240.

The D latch circuit 211 holds data or becomes transparent to data in accordance with the clock signal CK. Specifically, the D latch circuit 211 performs predetermined logical operations on the inverted clock signal CKB and data signal D. The logical operations will be discussed later in detail. If the clock signal CK is High as a result of a logical operation, the D latch circuit 211 holds the inverted signal of the data signal D as the inverted output signal QMB while outputting this signal QMB to the D latch circuit 221 via the signal line 904. If the clock signal CK is Low, the D latch circuit 211 inverts the data signal D and outputs the inverted signal as the inverted output signal QMB to the D latch circuit 221 via the signal line 904.

The D latch circuit 221 holds data or becomes transparent to data in accordance with the clock signal CK2. Specifically, the D latch circuit 221 performs predetermined logical operations on the clock signal CK2 and inverted output signal QMB. The logical operations will be discussed later in detail. If the clock signal CK is Low as a result of a logical operation, the D latch circuit 221 holds the inverted output signal QMB as the output signal QS and outputs this signal QS to the inverter 240 via the signal line 906. If the clock signal CK is High, the D latch circuit 221 becomes transparent to the inverted output signal QMB and outputs this signal as the output signal QS to the inverter 240 via the signal line 906.

The inverter 240 inverts the output signal QS, and outputs the inverted output signal QS as the output signal Q of the D flip-flop 131.

Structure of the D Latch Circuit

Figure 15:
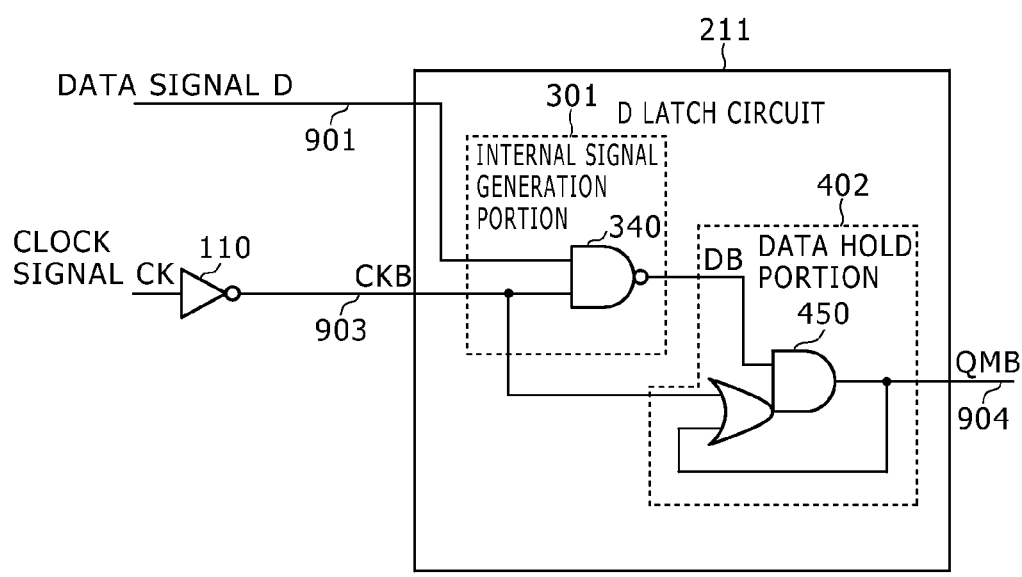
FIG. 15 is a circuit diagram showing a typical structure of a master D latch circuit as part of the second embodiment.

FIG. 15 is a circuit diagram showing a typical structure of the master D latch circuit 211 as part of the second embodiment. The structure of the D latch circuit 211 is substantially the same as that of the D latch circuit 220 of the first embodiment except that a data hold portion 402 replaces the data hold portion 401. The data hold portion 402 includes a complex gate 450.

The complex gate 450 performs predetermined logical operations on the internal signal DB, inverted clock signal CKB, and inverted output signal QMB. Specifically, the complex gate 450 has three input terminals to which the internal signal DB, inverted clock signal CKB, and inverted output signal QMB are input. The complex gate 450 performs an AND operation on the OR of the inverted clock signal CKB and inverted output signal QMB and on the internal signal DB, and outputs the result of the AND operation as the inverted output signal QMB to its own input terminal and to the slave D latch circuit 221 via the signal line 904.

When the clock signal CK goes Low, the NAND gate 340 outputs the inverted signal of the data signal D as the internal signal DB. The complex gate 450 becomes transparent to the internal signal DB and outputs this signal as the inverted output signal QMB.

When the clock signal CK goes High, the NAND gate 340 outputs a High-fixed signal as the internal signal DB. The complex gate 450 holds the immediately preceding inverted output signal QMB and outputs this signal at the same time.

Figure 16:
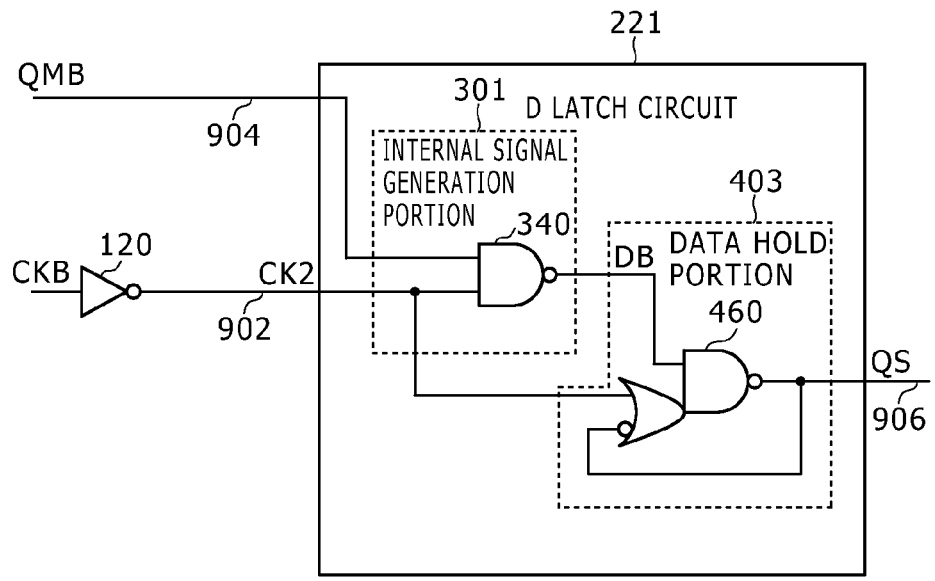
FIG. 16 is a circuit diagram showing a typical structure of a slave D latch circuit as part of the second embodiment.

FIG. 16 is a circuit diagram showing a typical structure of the slave D latch circuit 221 as part of the second embodiment. The structure of the D latch circuit 221 is substantially the same as that of the D latch circuit 220 of the first embodiment except that a data hold portion 403 replaces the data hold portion 401. The data hold portion 403 includes a complex gate 460.

The complex gate 460 performs predetermined logical operations on the internal signal DB, clock signal CK2, and output signal QS. Specifically, the complex gate 460 has three input terminals to which the internal signal DB, clock signal CK2, and output signal QS are input. The complex gate 460 performs a NAND operation on the OR of the clock signal CK2 and inverted output signal QS and on the internal signal DB, and outputs the result of the NAND operation as the output signal QS to its own input terminal and to the inverter 240 via the signal line 906.

When the clock signal CK goes High, the NAND gate 340 outputs the inverted signal of the inverted output signal QMB as the internal signal DB. The complex gate 460 inverts the internal signal DB and outputs the inverted signal as the output signal QS.

When the clock signal CK goes Low, the NAND gate 340 outputs a High-fixed signal as the internal signal DB. The complex gate 460 holds the immediately preceding inverted output signal QS and outputs this signal at the same time.

According to the second embodiment of the present disclosure described above, the complex gate 450 or 460 may hold data or become transparent to data. Because its D flip-flop 131 has a complex gate replacing a plurality of NOR or NAND gates, the second embodiment uses fewer logical elements, occupies a narrower circuit implementation area, and consumes less power than the first embodiment.

It was shown that the flip-flop 130 of the first embodiment has the clock signal CK2 and inverted clock signal CKB input to its master and slave D latch circuits respectively. On the other hand, because the D flip-flop 131 may have the inverted clock signal CKB and clock signal CK2 input to its master and slave latch circuits respectively, the wiring involved is simplified. This makes cell layout easier and improves process portability, i.e., portability between different technologies.

3. Third Embodiment

Structure of the Sequential Circuit

Figure 17:
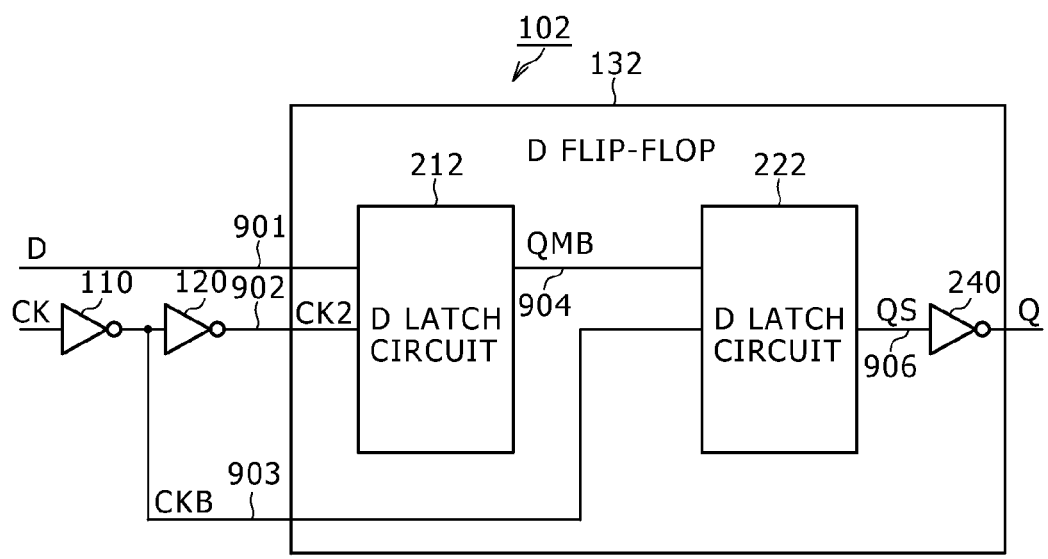
FIG. 17 is a circuit diagram showing a typical structure of a sequential circuit as a third embodiment of the present disclosure.

FIG. 17 is a circuit diagram showing a typical structure of a sequential circuit 102 as the third embodiment of the present disclosure. The structure of the sequential circuit 102 is substantially the same as that of the sequential circuit 100 of the first embodiment except that a D flip-flop 132 replaces the D flip-flop 130. The D flip-flop 132 is made up of a master D latch circuit 212, a slave D latch circuit 222, and an inverter 240.

The D latch circuit 212 holds data or becomes transparent to data in accordance with the clock signal CK2. Specifically, the D latch circuit 212 performs predetermined logical operations on the clock signal CK2 and data signal D. The logical operations will be discussed later in detail. If the clock signal CK is Low as a result of a logical operation, the D latch circuit 212 holds the inverted signal of the data signal D as the inverted output signal QMB while outputting this signal QMB to the D latch circuit 222 via the signal line 904. If the clock signal CK is High, the D latch circuit 212 inverts the data signal D and outputs the inverted signal as the output signal QMB to the D latch circuit 222 via the signal line 904.

The D latch circuit 222 holds data or becomes transparent to data in accordance with the inverted clock signal CKB. Specifically, the D latch circuit 222 performs predetermined logical operations on the inverted clock signal CKB and inverted output signal QMB. The logical operations will be discussed later in detail. If the clock signal CK is High as a result of a logical operation, the D latch circuit 222 holds the inverted output signal QMB as the output signal QS while outputting this signal QS to the inverter 240 via the signal line 906. If the clock signal CK is Low, the D latch circuit 222 becomes transparent to the inverted output signal QMB and outputs this signal as the output signal QS to the inverter 240 via the signal line 906.

The inverter 240 inverts the output signal QS and outputs the inverted signal as the output signal Q of the D flip-flop 132.

Structure of the D Latch Circuit

Figure 18:
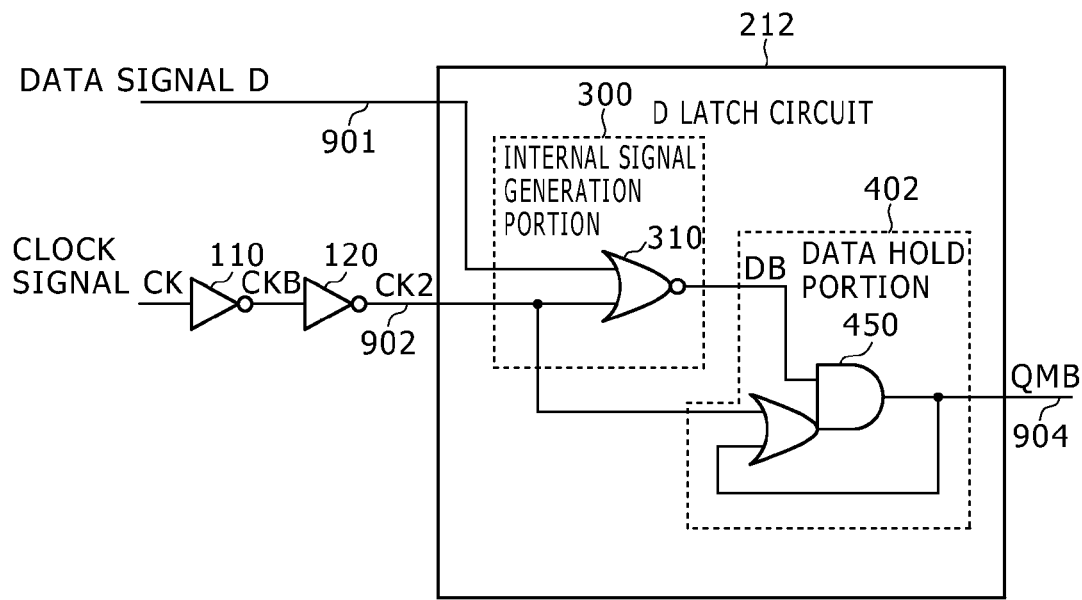
FIG. 18 is a circuit diagram showing a typical structure of a master D latch circuit as part of the third embodiment.

FIG. 18 is a circuit diagram showing a typical structure of the master D latch circuit 212 as part of the third embodiment. The structure of the D latch circuit 212 is substantially the same as that of the D latch circuit 210 of the first embodiment except that a data hold portion 402 replaces the data hold portion 400. The structure of the data hold portion 402 of the third embodiment is substantially the same as that of the data hold portion 402 of the second embodiment.

Figure 19:
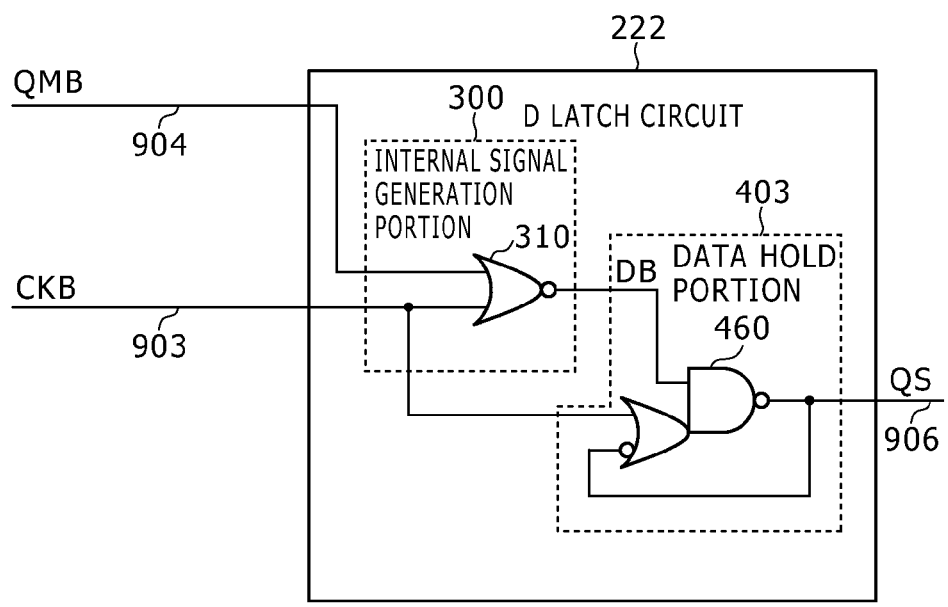
FIG. 19 is a circuit diagram showing a typical structure of a slave D latch circuit as part of the third embodiment.

FIG. 19 is a circuit diagram showing a typical structure of the slave D latch circuit 222 as part of the third embodiment. The structure of the D latch circuit 222 is substantially the same as that of the D latch circuit 210 of the first embodiment except that a data hold portion 403 replaces the data hold portion 400. The structure of the data hold portion 403 of the third embodiment is substantially the same as that of the data hold portion 403 of the second embodiment.

That is, the structure of the D flip-flop 132 of the third embodiment is substantially the same as that of the D flip-flop 131 of the second embodiment except that the NAND gate in the D flip-flop 131 is replaced by the NOR gate in the D flip-flop 132.

According to the third embodiment of the present disclosure described above, the complex gate 450 or 460 using the NOR gate helps hold data or become transparent to data. Thus the third embodiment can use fewer logical elements, occupy a narrower circuit implementation area, and consume less power than before. Because the wiring involved is simplified, cell layout is facilitated. That in turn improves process portability, i.e., portability between different technologies.

4. Fourth Embodiment

Structure of the Sequential Circuit

Figure 20:
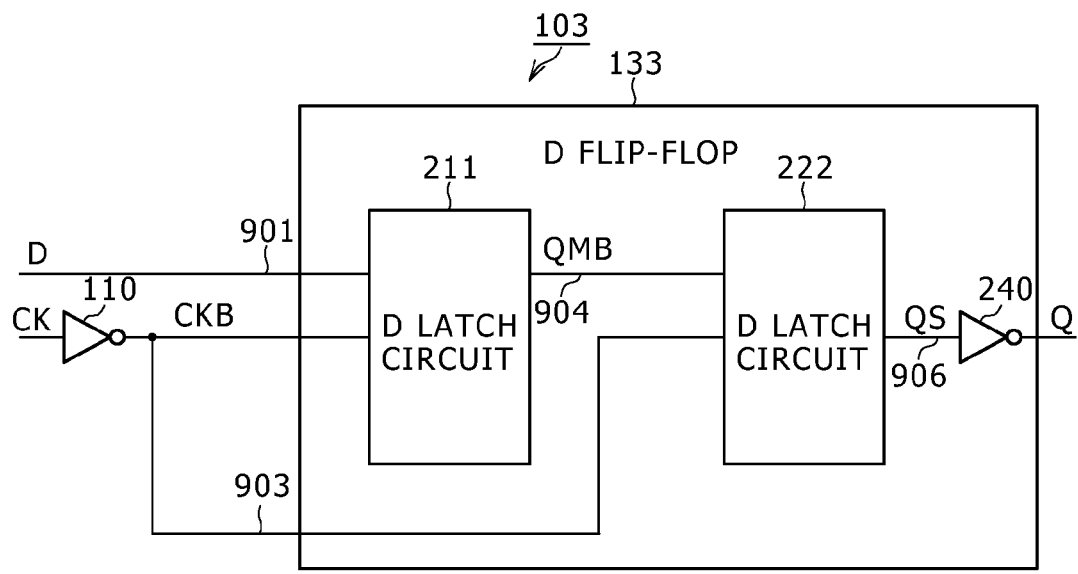
FIG. 20 is a circuit diagram showing a typical structure of a sequential circuit as a fourth embodiment of the present disclosure.

FIG. 20 is a circuit diagram showing a typical structure of the sequential circuit 103 as the fourth embodiment of the present disclosure. The structure of the sequential circuit 103 is substantially the same as that of the sequential circuit 100 of the first embodiment except that a D flip-flop 133 replaces the D flip-flop 130 and inverter 120. The D flip-flop 133 is made up of a master D latch circuit 211, a slave D latch circuit 222, and an inverter 240. The inverted clock signal CKB coming from the inverter 110 is input to the D latch circuits 211 and 222.

The structure of the D latch circuit 211 is substantially the same as the structure of the D latch circuit 211 of the second embodiment shown in FIG. 15. The structure of the D latch circuit 222 is substantially the same as that of the D latch circuit 222 of the third embodiment shown in FIG. 19. That is, the D flip-flop 133 of the fourth embodiment is one in which the NAND gate-equipped latch circuit is positioned as the master and the NOR gate-equipped latch circuit as the slave.

According to the fourth embodiment described above, the complex gate 450 or 460 using the NAND and NOR gates helps hold data or become transparent to data. Thus the fourth embodiment can use fewer logical elements, occupy a narrower circuit implementation area, and consume less power than before. Because the wiring involved is simplified, cell layout is facilitated. That in turn improves process portability, i.e., portability between different technologies. Also, the inverter 120 for generating the clock signal CK2 is not necessary. Elimination of the inverters 120 and related elements for CK2 generation further reduces power dissipation.

5. Fifth Embodiment

Structure of the Sequential Circuit

Figure 21:
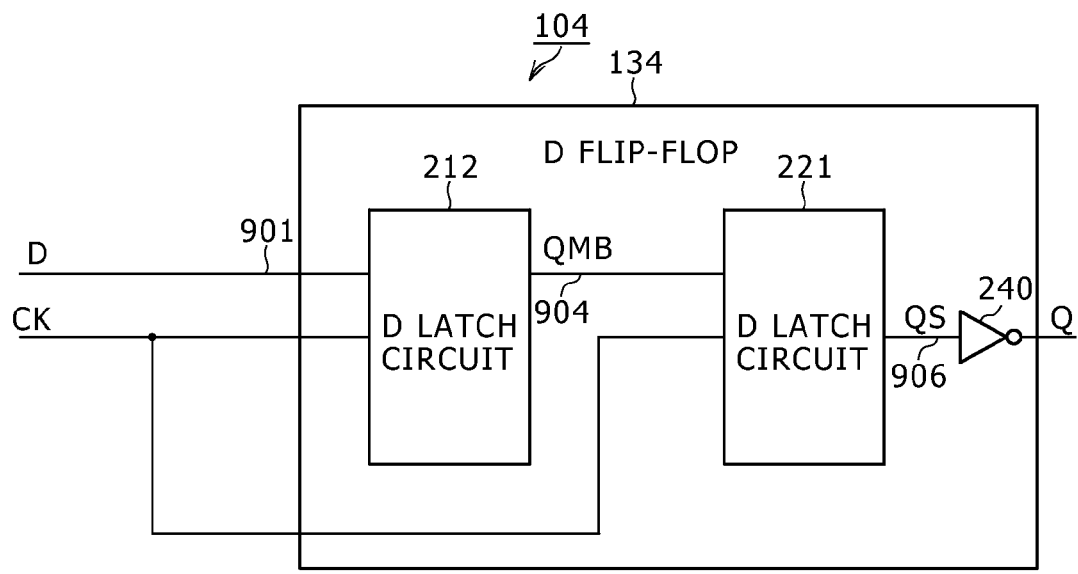
FIG. 21 is a circuit diagram showing a typical structure of a sequential circuit as a fifth embodiment of the present disclosure.

FIG. 21 is a circuit diagram showing a typical structure of a sequential circuit 104 as the fifth embodiment of the present disclosure. The structure of the sequential circuit 104 is substantially the same as that of the sequential circuit 100 of the first embodiment except that a D flip-flop 134 replaces the D flip-flop 130 and the inverters 110 and 120. The D flip-flop 134 is made up of a master D latch circuit 212, a slave D latch circuit 221, and an inverter 240. The clock signal CK is input to the D latch circuits 212 and 221.

The structure of the D latch circuit 212 is substantially the same as that of the D latch circuit 212 of the third embodiment shown in FIG. 18. The structure of the D latch circuit 221 is substantially the same as that of the D latch circuit 221 of the second embodiment shown in FIG. 16. That is, the D flip-flop 134 of the fifth embodiment is one in which the NOR gate-equipped latch circuit is positioned as the master and the NAND gate-equipped latch circuit as the slave.

According to the fifth embodiment described above, the complex gate 450 or 460 using the NOR and NAND gates helps hold data or become transparent to data. Thus the fifth embodiment can use fewer logical elements, occupy a narrower circuit implementation area, and consume less power than before. Because the wiring involved is simplified, cell layout is facilitated. That in turn improves process portability, i.e., portability between different technologies. Also, the inverters 110 and 120 for generating the clock signals CKB and CK2 are not necessary. Elimination of the inverters 110 and 120 and related elements for CKB and CK2 generation further reduces power dissipation.

The embodiments and their variations described above are merely examples in which the present disclosure may be implemented. As is clear from above, the particulars of the embodiments and their variations in the description of the preferred embodiments correspond basically to the disclosed matters claimed in the appended claims. Likewise, the disclosed matters named in the appended claims correspond basically to the particulars with the same names in the description of the preferred embodiments. However, these embodiments and their variations and other examples of the present disclosure are not limitative thereof, and it should be understood by those skilled in the art that various modifications, combinations, sub-combinations and alterations may occur depending on design requirements and other factor in so far as they are within the scope of the appended claims or the equivalents thereof.

The present invention contains subject matter related to that disclosed in Japanese Priority Patent Application JP 2011-014729 filed in the Japan Patent Office on Jan. 27, 2011, the entire content of which is hereby incorporated by reference.

What is claimed is:

1. A circuit comprising:
a first delay latch circuit that includes a first internal signal generation portion and a first data hold portion, wherein
the first internal signal generation portion includes a first NOR gate, the first NOR gate including a first input connected to a first data signal line and a second input connected to a clock signal line, and
the first data hold portion includes a second NOR gate and a third NOR gate, the second NOR gate including a first input connected to an output node of the first NOR gate and a second input connected to an output node of the third NOR gate, and the third NOR gate including a first input connected to an inverted clock signal line and a second input connected to an output node of the second NOR gate, wherein
the first NOR gate includes a first internal signal output circuit and a first delay transistor, the first delay transistor being configured to delay a signal output from the first inter signal output circuit.

2. The circuit according to claim 1, wherein
the clock signal line is connected to an output of a second inverter, an input of the second inverter being connected to an output of a first inverter, and an input of the first inverter being connected to a first clock signal line, and
the inverted clock signal line is connected to the output of the first inverter.

3. The circuit according to claim 1, wherein
the first NOR gate further includes a first transistor, second transistor, third transistor, and a fourth transistor, wherein
a gate of the first transistor and a gate of the third transistor are connected to the first data signal line,
a gate of the second transistor and a gate of the fourth transistor are connected to the clock signal line,
a first source/drain region of the first transistor is connected to a power source,
a first source/drain region of the fourth transistor is connected to a ground, and
a second source/drain region of the fourth transistor is connected to a first source/drain region of the first delay transistor.

4. The circuit according to claim 3, wherein
a gate of the first delay transistor is connected to the power source,
a second source/drain region of the first transistor is connected to a first source/drain region of the second transistor,
a second source/drain region of the second transistor is connected to the output node of the first NOR gate,
a first source/drain region of the third transistor is connected to the output node of the first NOR gate,
a second source/drain region of the third transistor is connected to the ground, and
the second source/drain region of the first delay transistor is connected to the output node of the first NOR gate.

5. The circuit according to claim 4, wherein
the first transistor and the second transistor are pMOS transistors, and
the third transistor, the fourth transistor, and the first delay transistor are nMOS transistors.

6. The circuit according to claim 1, wherein
the second NOR gate includes a fifth transistor, a sixth transistor, a seventh transistor, and an eighth transistor, wherein
a gate of the fifth transistor and a gate of the seventh transistor are connected to the output node of the first NOR gate,
a gate of the sixth transistor and a gate of the eighth transistor are connected to the output node of the third NOR gate,
a first source/drain region of the fifth transistor is connected to a power source,
a first source/drain region of the eighth transistor is connected to a ground, and
a second source/drain region of the eighth transistor is connected to the output node of the second NOR gate.

7. The circuit according to claim 6, wherein
a second source/drain region of the fifth transistor is connected to a first source/drain region of the sixth transistor,
a second source/drain region of the sixth transistor is connected to the output node of the second NOR gate,
a first source/drain region of the seventh transistor is connected to the output node of the second NOR gate, a second source/drain region of the third transistor is connected to the ground, and a second source/drain region of the seventh transistor is connected to the ground.

8. The circuit according to claim 7, wherein the fifth transistor and the sixth transistor are pMOS transistors, and the seventh transistor and the eighth transistor are nMOS transistors.

9. A circuit comprising:

first delay latch that includes a first internal signal generation portion and a data hold portion, wherein the first internal signal generation portion includes a first NOR gate, the first NOR gate including a first input connected to a first data signal line and a second input connected to a clock signal line, and the first data hold portion includes a second NOR gate and a third NOR gate, the second NOR gate including a first input connected to an output node of the first NOR gate and a second input connected to an output node of the third NOR gate, and the third NOR gate including a first input connected to an inverted clock signal line and a second input connected to an output node of the second NOR gate; and a second delay latch circuit that includes a second internal signal generation portion and a second data hold portion, wherein the second internal signal generation portion includes a first NAND gate, the first NAND gate including a first input connected to an output of a third inverter, an input of the third inverter being connected to the output node of the second NOR gate, and the first NAND gate including a second input node connected to the clock signal line, and the second data hold portion includes a second NAND gate and a third NAND gate, the second NAND gate including a first input connected to an output node of the first NAND gate and a second input connected to an output node of the third NAND gate, and the third NAND gate including a first input connected to the inverted clock signal line and a second input connected to an output node of the second NAND gate.

10. The circuit according to claim 9, wherein the first NAND gate includes a second internal signal output circuit and a second delay transistor, the second delay transistor being configured to delay a signal output from the second internal signal output circuit.

11. The circuit according to claim 10, wherein the first NAND gate further includes a ninth transistor, tenth transistor, eleventh transistor, and a twelfth transistor, wherein a gate of the ninth transistor and a gate of the twelfth transistor are connected to the output of the third inverter, a gate of the tenth transistor and a gate of the eleventh transistor are connected to the clock signal line, a first source/drain region of the ninth transistor and a first source/drain region of the tenth transistor are connected to a power source, a first source/drain region of the twelfth transistor is connected to a ground, and a gate of the second delay transistor is connected to the ground.

12. The circuit according to claim 11, wherein a second source/drain region of the tenth transistor is connected to a first source/drain region of the second delay transistor, a second source/drain region of the ninth transistor is connected to an output node of the first NAND gate, a second source/drain region of the second delay transistor is connected to the output node of the first NAND gate, a first source/drain region of the eleventh transistor is connected to the output node of the first NAND gate, and a second source/drain region of the eleventh transistor is connected to a second source/drain region of the twelfth transistor.

13. The circuit according to claim 12, wherein the ninth transistor, the tenth transistor, and the second delay transistor are pMOS transistors, and the eleventh transistor and the twelfth transistor are nMOS transistors.

14. The circuit according to claim 9, wherein the second NAND gate includes a thirteenth transistor, a fourteenth transistor, a fifteenth transistor, and a sixteenth eighth transistor, wherein a gate of the thirteenth transistor and a gate of the sixteenth transistor are connected to the output node of the first NAND gate, a gate of the fourteenth transistor and a gate of the fifteenth transistor are connected to the output node of the third NAND gate, a first source/drain region of the thirteenth and a first source/drain region of the fourteenth transistor are connected to a power source, and a first source/drain region of the sixteenth transistor is connected to a ground.

15. The circuit according to claim 14, wherein a second source/drain region of the thirteenth transistor and a second source/drain region of the fourteenth transistor are connected to the output node of the second NAND gate, a first source/drain region of the fifteenth transistor is connected to the output node of the second NAND gate, and a second source/drain region of the fifteenth transistor is connected to a second source/drain region of the sixteenth transistor.

16. The circuit according to claim 15, wherein the thirteenth transistor and the fourteenth transistor are pMOS transistors, and the fifteenth transistor and the sixteenth transistor are nMOS transistors.

17. The circuit according to claim 9, further comprising:

a fourth inverter having an input connected to the output node of the second NOR gate.

18. A circuit comprising:

a first delay latch circuit that includes a first internal signal generation portion and a first data hold portion, wherein the first internal signal generation portion includes a first NAND gate, the first NAND gate including a first input connected to a first data signal line and a second input connected to a clock signal line, and the first data hold portion includes a second NAND gate and a third NAND gate, the second NAND gate including a first input connected to an output node of the first NAND gate and a second input connected to an output node of the third NAND gate, and the third NAND gate including a first input connected to an inverted clock signal line and a second input connected to an output node of the second NAND gate; and a second delay latch circuit that includes a second internal signal generation portion and a second data hold portion, wherein the second internal signal generation portion includes a first NOR gate, the first NOR gate including a first input connected to an output of a third inverter, an input of the third inverter being connected to the output node of the second NAND gate, and the first NAND gate including a second input node connected to the clock signal line, and the second data hold portion includes a second NOR gate and a third NOR gate, the second NOR gate including a first input connected to an output node of the first NOR gate and a second input connected to an output node of the third NOR gate, and the third NOR gate including a first input connected to the inverted clock signal line and a second input connected to an output node of the second NOR gate.

19. The circuit according to claim 18, wherein
the clock signal line is connected to an output of a second inverter, an input of the second inverter being connected to an output of a first inverter, and an input of the first inverter being connected to a first clock signal line, and
the inverter clock signal line is connected to the output of the first inverter.

20. The circuit according to claim 18, wherein
the first NAND gate includes a first internal signal output circuit and a first delay transistor, the first delay transistor being configured to delay a signal output from the first internal signal output circuit.

21. The circuit according to claim 20, wherein
the first NOR gate includes a second internal signal output circuit and a second delay transistor, the second delay transistor being configured to delay a signal output from the second internal signal output circuit.

22. The circuit according to claim 18, further comprising:
a fourth inverter having an input connected to the output node of the second NOR gate.

23. A circuit comprising:
a first delay latch circuit includes a first internal signal generation portion and a first data hold portion, wherein
the first internal signal generation portion includes a first NAND gate, the first NAND gate including a first input connected to a first data signal line and a second input connected to an inverted clock signal line, and
the first data hold portion includes a second NAND gate and first OR gate, the second NAND gate including a first input connected to an output node of the first NAND gate and a second input connected to an output node of the first OR gate, and the first OR gate including a first input connected to the inverted clock signal line and a second input connected to an output node of the second NAND gate; and a second delay latch circuit that includes a second internal signal generation portion and a second data hold portion, wherein
the second internal signal generation portion includes a third NAND gate, the third NAND gate including a first input connected to the output node of the second NAND gate and second input connected to a clock signal line, and
the second data hold portion includes a fourth NAND gate and second NOR gate, the fourth NAND gate including a first input connected to an output node of the third NAND gate and a second input connected to an output node of the second NOR gate, and the second NOR gate including a first input connected to the clock signal line and a second input connected to an output node of the fourth NAND gate.

24. A circuit comprising:
a first delay latch circuit that includes a first internal signal generation portion and a data hold portion, wherein
the first internal signal generation portion includes a first NOR gate, the first NOR gate including a first input connected to a first data signal line and a second input connected to a clock signal line, and
the first data hold portion includes a first NAND gate and a first OR gate, the first NAND gate including a first input connected to an output node of the first NOR gate and a second input connected to an output node of the first OR gate, and the first OR gate including a first input connected to the clock signal line and a second input connected to an output node of the first NAND gate; and
a second delay latch circuit that includes a second internal signal generation portion and a second data hold portion, wherein
the second internal signal generation portion includes a second NOR gate, the second NOR gate including a first input connected to the output node of the first NAND gate and second input connected to an inverted clock signal line, and
the second data hold portion includes a second NAND gate and second OR gate, the second NAND gate including a first input connected to an output node of the second OR gate and a second input connected to an output node of the second NOR gate, and the second OR gate including a first input connected to the inverted clock signal line and a second input connected to an output node of the second NAND gate.

* * * * *